United States Patent
Kominato et al.

(10) Patent No.: US 9,256,122 B2
(45) Date of Patent: Feb. 9, 2016

(54) MASK BLANK, TRANSFER MASK, METHOD OF MANUFACTURING A TRANSFER MASK, AND METHOD OF MANUFACTURING A SEMICONDUCTOR DEVICE

(71) Applicant: HOYA CORPORATION, Tokyo (JP)

(72) Inventors: Atsushi Kominato, Tokyo (JP); Masahiro Hashimoto, Tokyo (JP); Osamu Nozawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 42 days.

(21) Appl. No.: 13/920,128

(22) Filed: Jun. 18, 2013

(65) Prior Publication Data

US 2013/0280646 A1 Oct. 24, 2013

Related U.S. Application Data

(62) Division of application No. 13/248,896, filed on Sep. 29, 2011, now Pat. No. 8,501,372.

(30) Foreign Application Priority Data

Sep. 30, 2010 (JP) .................. 2010-221661

(51) Int. Cl.
*G03F 1/50* (2012.01)
*G03F 1/58* (2012.01)
*H01L 21/266* (2006.01)
*H01L 21/268* (2006.01)
*G03F 1/00* (2012.01)
*G03F 7/20* (2006.01)

(52) U.S. Cl.
CPC .. *G03F 1/50* (2013.01); *G03F 1/00* (2013.01); *G03F 1/58* (2013.01); *G03F 7/20* (2013.01); *H01L 21/266* (2013.01); *H01L 21/268* (2013.01)

(58) Field of Classification Search
USPC .................. 430/5, 30; 428/428, 432; 378/35
See application file for complete search history.

(56) References Cited

U.S. PATENT DOCUMENTS

2010/0092874 A1* 4/2010 Nozawa et al. ............. 430/5
2010/0092894 A1  4/2010 Nozawa et al.

FOREIGN PATENT DOCUMENTS

| JP | 2006-078825 A | 3/2006 |
|---|---|---|
| JP | 2007-241136 A | 9/2007 |

(Continued)

OTHER PUBLICATIONS

Azpiroz, Jaione Tirapu, et al., "Massively-Parrallel FDTD Simulations to Address Mask Electromagnetic Effects in Hyper-NA Immersion Lithography", Proc. of SPIE, 2008, pp. 69240Y-1-69240Y-15, vol. 6924.

(Continued)

*Primary Examiner* — Stephen Rosasco
(74) *Attorney, Agent, or Firm* — Sughrue Mion, PLLC

(57) ABSTRACT

A mask blank for use in the manufacture of a binary mask adapted to be applied with ArF excimer laser exposure light has, on a transparent substrate, a light-shielding film for forming a transfer pattern. The light-shielding film has a laminated structure of a lower layer and an upper layer and has an optical density of 2.8 or more for exposure light and a thickness of 45 nm or less. The lower layer is made of a material in which the total content of a transition metal and silicon is 90 at % or more, and has a thickness of 30 nm or more. The upper layer has a thickness of 3 nm or more and 6 nm or less. The phase difference between exposure light transmitted through the light-shielding film and exposure light transmitted in air for a distance equal to the thickness of the light-shielding film is 30 degrees or less.

20 Claims, 13 Drawing Sheets

(56) References Cited

FOREIGN PATENT DOCUMENTS

| | | |
|---|---|---|
| KR | 10-2010-0048903 A | 5/2010 |
| WO | 2005/124454 A1 | 12/2005 |

OTHER PUBLICATIONS

Office Action issued in corresponding Korean Patent Application No. 10-2013-0058960 dated Apr. 21, 2015. Abstract and Partial English Translation.

\* cited by examiner

MASK BLANK, TRANSFER MASK, METHOD OF MANUFACTURING A TRANSFER MASK, AND METHOD OF MANUFACTURING A SEMICONDUCTOR DEVICE

This application is a Divisional of U.S. application Ser. No. 13/248,896 filed Sep. 29, 2011, which claims the benefit of priority from Japanese Patent Application No. 2010-221661, filed on Sep. 30, 2010. The entire disclosures of the prior applications are considered part of the disclosure of the accompanying Divisional application, and are hereby incorporated by reference.

TECHNICAL FIELD

This invention relates to a mask blank and a transfer mask for use in the manufacture of semiconductor devices or the like and further relates to a method of manufacturing a transfer mask and a method of manufacturing a semiconductor device.

BACKGROUND OF THE ART

The miniaturization of semiconductor devices and the like is advantageous in bringing about an improvement in performance and function (higher-speed operation, lower power consumption, etc.) and a reduction in cost and thus has been accelerated more and more. The lithography technique has been supporting this miniaturization and transfer masks are a key technique along with exposure apparatuses and resist materials.

In recent years, the development of the DRAM half-pitch (hp) 45 nm to 32 nm generations according to the semiconductor device design rule has been progressing. This corresponds to about ¼ to ⅙ of a wavelength 193 nm of ArF excimer laser exposure light (hereinafter referred to as "ArF exposure light"). Particularly, in the DRAM hp45 nm and subsequent generations, only the application of the resolution enhancement technology (RET) such as the conventional phase shift method, oblique incidence illumination method, and pupil filter method and the optical proximity correction (OPC) technique has been becoming insufficient and the hyper-NA (numerical aperture) technique (immersion lithography) has been becoming necessary.

In the meantime, circuit patterns necessary in the manufacture of semiconductor devices are formed in sequence by exposing a photomask (reticle) pattern a plurality of times onto a semiconductor wafer. For example, a reduced projection exposure apparatus (exposure apparatus) with a predetermined reticle set therein repeatedly projects and exposes a pattern of the reticle while sequentially shifting a projection area on a semiconductor wafer (step-and-repeat system), or repeatedly projects and exposes a pattern of the reticle while synchronously scanning the reticle and a semiconductor wafer with respect to a projection optical system (step-and-scan system). These systems have been predominant. As a consequence, a predetermined number of integrated circuit chip areas are formed in the wafer.

A photomask (reticle) has an area formed with a transfer pattern and a peripheral area around the transfer pattern area, i.e. an edge area along four sides in the photomask (reticle). When exposing the transfer pattern of the photomask (reticle) while sequentially shifting a projection area on a semiconductor wafer, the transfer pattern is exposed and transferred to the projection areas so that the photomask peripheral areas overlap each other for the purpose of increasing the number of integrated circuit chips to be formed. Normally, a mask stage of an exposure apparatus is provided with a shielding plate for blocking irradiation of exposure light onto the photomask peripheral area. However, in the case of blocking the irradiation of the exposure light by the shielding plate, there are problems of positional accuracy limitation and of light diffraction phenomenon so that it is not possible to avoid leakage of the exposure light to the photomask peripheral area (hereinafter, this exposure light will be referred to as "leakage light"). If this leakage light to the photomask peripheral area is transmitted through the photomask, there is a possibility of sensitizing a resist on the wafer.

In order to prevent the sensitization of the resist on the wafer due to such overlapping exposure, a light-shielding band (a band of shielding material or light-shielder ring) is formed in the photomask peripheral area by mask processing. Normally, it is reported that, in an area, where the light-shielding band is formed, of the photomask peripheral area, an OD value (optical density) of 3 or more is desirable and that of at least about 2.8 is necessary for preventing the sensitization of the resist on the wafer due to the overlapping exposure.

In the case of a binary mask, since the light-shielding performance of a light-shielding film is high, the light-shielding film serves to form a light-shielding film pattern in a transfer pattern area and further to form a light-shielding band in a peripheral area around the transfer pattern area.

The light-shielding film is also required to have a certain low front-surface reflectance for exposure light. In view of this, the light-shielding film generally has a laminated structure of at least two layers, i.e. a layer for ensuring the light-shielding performance and a layer (front-surface antireflection layer) for reducing the front-surface reflectance. The front-surface antireflection layer has a difficulty in enhancing the light-shielding performance in terms of its properties and thus cannot contribute to a reduction in the thickness of the light-shielding film. The reduction in the thickness of the light-shielding film has these restrictions.

When the thickness of the light-shielding film is reduced, the OD (optical density) value is also reduced. In the case of a chromium-based light-shielding film, the total thickness of about 60 nm is minimally required for achieving OD=3 which is generally required, and therefore, a large reduction in the thickness of the film is difficult to achieve (see, e.g. Patent Document 1: JP-A-2007-241136, paragraph [0005]).

Further, also in the case of, for example, a so-called binary photomask comprising a light-shielding film having a laminated structure of MoSi-based materials, such as a light-shielding film having a laminated structure of a MoSiN light-shielding layer and a MoSiON antireflection layer from the substrate side, the total thickness of normally about 60 nm is minimally required for achieving OD=2.3 which is required, and therefore, a large reduction in the thickness of the film is difficult to achieve (Patent Document 2: JP-A-2006-78825).

On the other hand, Patent Document 3 (WO2005/124464) discloses a mask blank comprising a light-semitransmissive film. This light-semitransmissive film has a property of transmitting exposure light at a predetermined transmittance and this property is substantially the same as that of a conventional halftone phase shift film. However, this light-semitransmissive film also has a property such that the phase difference between exposure light transmitted through a light-semitransmissive portion formed with the light-semitransmissive film and exposure light transmitted through a light-transmissive portion formed with no light-semitransmissive film is small. This property is totally different from that of the conventional halftone phase shift film. The mask blank comprising this light-semitransmissive film is used for manufacturing an enhancer mask.

SUMMARY OF THE INVENTION

In the meantime, in binary masks in the DRAM half-pitch (hp) 40 nm and subsequent generations according to the semiconductor device design rule, the line width of a transfer pattern of a transfer mask is smaller than the wavelength 193 nm of ArF exposure light and, as a result of adopting the resolution enhancement technology for coping with it, there has arisen a problem that if the thickness of a light-shielding film pattern in a transfer pattern area (main pattern area) is large, a bias (correction amount of pattern line width or the like) due to the electromagnetic field (EMF) effect becomes large. A bias due to the EMF effect largely affects the CD accuracy of the line width of a transfer pattern onto a resist on a semiconductor wafer. Therefore, in order to suppress the influence due to the EMF bias, it is necessary to carry out simulation of the EMF effect, thereby performing correction of a transfer pattern to be formed in a transfer mask when manufacturing the transfer mask. Calculation of this transfer pattern correction becomes more complicated as the EMF bias increases. Further, a transfer pattern after the correction also becomes more complicated as the EMF bias increases. As a consequence, a large load is applied to the manufacture of the transfer mask. These new problems have arisen due to the increase in EMF bias.

Optical simulation in mask design of a binary mask is largely aimed at calculating a shape of a correction pattern such as OPG (optical proximity correction) or SRAF (sub-resolution assist features) to be additionally disposed, a correction amount (bias amount) of pattern line width, and so on so that a designed transfer pattern is exposed and transferred to a transfer object (resist on a wafer, or the like) as designed. As this mask-design optical simulation, there is TMA (thin mask analysis). TMA calculates a shape of a correction pattern and a correction amount of pattern line width assuming that a light-shielding film of a transfer mask is an ideal film that has a predetermined optical density with its thickness being zero. Because of the simple simulation being carried out with the ideal film, there is a large merit that the calculation load of the simulation is small. However, since this is the simulation that does not take into account the EMF effect, the TMA simulation results alone are insufficient for a recent fine pattern which is largely affected by the EMF effect.

The present inventors have intensively studied the subject of the above-mentioned EMF effect.

First, the present inventors have paid attention to the fact that, in the case of a light-shielding film with a small influence of the EMF effect, it is easy to take advantage of the TMA simulation and thus to reduce the load of EMF bias correction calculation.

As a result of further studying a light-shielding film with a small influence of the EMF effect, it has been found that, even in the case of a binary transfer mask, the phase difference between exposure light transmitted through a light-shielding portion formed with a light-shielding film and exposure light transmitted through a light-transmissive portion formed with no light-shielding film (hereinafter, this phase difference will be referred to simply as a "phase difference") is related to the influence of the EMF effect. Specifically, it has been found by simulation that as the phase difference of the light-shielding film decreases, the EMF bias also decreases.

Further, it has been found that the thickness of the light-shielding film is also related to the EMF bias. Specifically, if the thickness of the light-shielding film is less than 50 nm, the load of transfer pattern correction calculation for correcting the influence of the EMF bias becomes small and thus the transfer mask manufacturing load also becomes small. Further, if the thickness of the light-shielding film is 47 nm or less, the EMF bias can be considerably reduced. Further, if the thickness of the light-shielding film is 40 nm or less, a more significant EMF bias reducing effect can be obtained. These results have been made clear by simulation.

In layers forming the light-shielding film, a front-surface antireflection layer as an upper layer is required to have an antireflection function and thus is required to contain a certain or more amount of oxygen and/or nitrogen so that the refractive index thereof inevitably becomes high. Therefore, the front-surface antireflection layer serves to produce a large plus-direction phase difference. In order to provide the front-surface antireflection layer with the antireflection function, the front-surface antireflection layer should be formed of a material with a small extinction coefficient k. Since most of the light-shielding performance of the entire light-shielding film should be achieved by a light-shielding layer as a lower layer, the light-shielding layer should be formed of a material with a large extinction coefficient k.

Taking these into account, first, a material with a small refractive index n and with a large extinction coefficient k has been selected as the light-shielding layer (lower layer). It has been found that the material having such properties is a transition metal silicide-based material in which the content of other components (particularly oxygen and/or nitrogen) adapted to increase the refractive index n of the material or to reduce the extinction coefficient k of the material is limited to less than 10 at %. That is, as the material forming the light-shielding layer, a selection has been made of a material in which the total content of a transition metal and silicon is 90 at % or more.

Next, a study has been made of a film structure that simultaneously satisfies three conditions that the total thickness of the light-shielding film is 45 nm or less, that the optical density thereof for exposure light is 2.8 or more, and that the phase difference thereof is 30 degrees or less. It has been found that, in order to achieve the optical density of 2.8 or more in the laminated structure with the front-surface antireflection layer having a low optical density while the thickness of the entire light-shielding film is 45 nm or less, the light-shielding layer (lower layer) formed of the above-mentioned material should have a thickness of at least 30 nm. The light-shielding layer of this thickness serves to produce only a small minus-direction phase difference. As a consequence, if the thickness of the front-surface antireflection layer is set to a conventional thickness, the phase difference over the entire light-shielding film largely exceeds plus 30 degrees. On the other hand, owing to the development of exposure apparatuses in recent years, the influence of front-surface reflection from a light-shielding film upon exposure and transfer has been decreasing so that even if the front-surface reflectance is more or less greater than conventional, it tends to be allowed. Taking these into account, as a result of loosely setting the front-surface reflectance of the light-shielding film to less than 50% and making a study, it has been found that, using the selected material of the light-shielding layer, if the thickness of the front-surface antireflection layer is 3 nm or more, the front-surface reflectance can be set to less than 50%. It has also been found that if the thickness of the front-surface antireflection layer is 6 nm or less, the phase difference over the entire light-shielding film can be suppressed to within 30 degrees.

Synthetically taking into account the results of various studies described above, this invention has been completed.

It is an object of this invention to provide a mask blank which comprises a light-shielding film with a reduced EMF bias so that various loads applied to the manufacture of a transfer mask are largely reduced, and which can simultaneously satisfy a condition that when the mask blank is formed into the transfer mask, the light-shielding film ensures an optical density that can prevent sensitization of a resist film on a semiconductor wafer due to leakage light caused by overlapping exposure, and further to provide such a transfer mask, a method of manufacturing such a transfer mask, and a method of manufacturing a semiconductor device using such a transfer mask.

This invention has the following structures.

(Structure 1)

A mask blank for use in the manufacture of a binary mask adapted to be applied with ArF excimer laser exposure light, the mask blank comprising, on a transparent substrate, a light-shielding film for forming a transfer pattern, wherein the light-shielding film has a laminated structure of a light-shielding layer (lower layer) and a front-surface antireflection layer (upper layer) and has an optical density of 2.8 or more for the exposure light and a thickness of 45 nm or less, the light-shielding layer (lower layer) is made of a material in which the total content of a transition metal and silicon is 90 at °/0 or more, and has a thickness of 30 nm or more, the front-surface antireflection layer (upper layer) has a thickness of 3 nm or more and 6 nm or less, and a phase difference between the exposure light transmitted through the light-shielding film and the exposure light transmitted in air for a distance equal to the thickness of the light-shielding film is 30 degrees or less.

(Structure 2)

The mask blank according to Structure 1, wherein a ratio obtained by dividing a content of the transition metal in the light-shielding layer (lower layer) by the total content of the transition metal and silicon in the lower layer is 42% or less.

(Structure 3)

The mask blank according to Structure 1 or 2, wherein the transition metal in the light-shielding layer (lower layer) is molybdenum (Mo).

(Structure 4)

A mask blank for use in the manufacture of a binary mask adapted to be applied with ArF excimer laser exposure light, the mask blank comprising, on a transparent substrate, a light-shielding film for forming a transfer pattern, wherein the light-shielding film has a laminated structure of a light-shielding layer (lower layer) and a front-surface antireflection layer (upper layer) and has an optical density of 2.8 or more for the exposure light and a thickness of 45 nm or less, the light-shielding layer (lower layer) is made of a material having a refractive index n of less than 2.00 and an extinction coefficient k of 2.37 or more and has a thickness of 30 nm or more, the front-surface antireflection layer (upper layer) has a thickness of 3 nm or more and 6 nm or less, and a phase difference between the exposure light transmitted through the light-shielding film and the exposure light transmitted in air for a distance equal to the thickness of the light-shielding film is 30 degrees or less.

(Structure 5)

The mask blank according to any of Structures 1 to 4, wherein the front-surface antireflection layer (upper layer) is made of a material having a refractive index n of 2.00 or more and an extinction coefficient k of 1.00 or less.

(Structure 6)

The mask blank according to any of Structures 1 to 5, wherein the light-shielding layer (lower layer) has a thickness of 42 nm or less, (Structure 7)

The mask blank according to any of Structures 1 to 6, wherein the front-surface antireflection layer (upper layer) is composed mainly of a material containing a transition metal, silicon, and at least one element from oxygen and nitrogen, a material containing silicon and at least one element from oxygen and nitrogen, or a material containing a transition metal and at least one element from oxygen and nitrogen.

(Structure 8)

The mask blank according to Structure 7, wherein the transition metal in the front-surface antireflection layer (upper layer) is molybdenum (Mo).

(Structure 9)

A method of manufacturing a transfer mask, comprising an etching step of patterning, by etching, the light-shielding film in the mask blank according to any of Structures 1 to 8.

(Structure 10)

A binary transfer mask adapted to be applied with ArF excimer laser exposure light, the transfer mask comprising, on a transparent substrate, a light-shielding film having a transfer pattern, wherein the light-shielding film has a laminated structure of a light-shielding layer (lower layer) and a front-surface antireflection layer (upper layer) and has an optical density of 2.8 or more for the exposure light and a thickness of 45 nm or less, the light-shielding layer (lower layer) is made of a material in which the total content of a transition metal and silicon is 90 at % or more, and has a thickness of 30 nm or more, the front-surface antireflection layer (upper layer) has a thickness of 3 nm or more and 6 nm or less, and a phase difference between the exposure light transmitted through the light-shielding film and the exposure light transmitted in air for a distance equal to the thickness of the light-shielding film is 30 degrees or less.

(Structure 11)

A binary transfer mask adapted to be applied with ArF excimer laser exposure light, the transfer mask comprising, on a transparent substrate, a light-shielding film having a transfer pattern, wherein the light-shielding film has a laminated structure of a light-shielding layer (lower layer) and a front-surface antireflection layer (upper layer) and has an optical density of 2.8 or more for the exposure light and a thickness of 45 nm or less, the light-shielding layer (lower layer) is made of a material having a refractive index n of less than 2.00 and an extinction coefficient k of 2.37 or more and has a thickness of 30 nm or more, the front-surface antireflection layer (upper layer) has a thickness of 3 nm or more and 6 nm or less, and a phase difference between the exposure light transmitted through the light-shielding film and the exposure light transmitted in air for a distance equal to the thickness of the light-shielding film is 30 degrees or less.

(Structure 12)

The binary transfer mask according to Structure 10 or 11, wherein the transfer pattern of the light-shielding film includes a line & space pattern of half-pitch 40 nm or less.

(Structure 13)

A method of manufacturing a semiconductor device, comprising forming a circuit pattern on a semiconductor wafer using the binary transfer mask according to any of Structures 10 to 12.

(Structure 14)

The method according to Structure 13, wherein the circuit pattern formed on the semiconductor wafer includes a line & space pattern of half-pitch 40 nm or less.

According to this invention, it is possible to realize and provide a light-shielding film with a reduced EMF bias so that various loads applied to the manufacture of a transfer mask are largely reduced. Further, this light-shielding film with the reduced EMF bias can simultaneously satisfy a condition that the light-shielding film ensures an optical density that can prevent sensitization of a resist film on a semiconductor wafer due to leakage light caused by overlapping exposure.

DESCRIPTION OF THE EXEMPLARY EMBODIMENT

Hereinbelow, this invention will be described in detail.

A mask blank according to this invention is for use in the manufacture of a binary mask adapted to be applied with ArF excimer laser exposure light, the mask blank comprising, on a transparent substrate, a light-shielding film for forming a transfer pattern, wherein the light-shielding film has a laminated structure of a light-shielding layer (lower layer) and a front-surface antireflection layer (upper layer) and has an optical density of 2.8 or more for the exposure light and a thickness of 45 nm or less, the light-shielding layer (lower layer) is made of a material in which the total content of a transition metal and silicon is 90 at % or more, and has a thickness of 30 nm or more, the front-surface antireflection layer (upper layer) has a thickness of 3 nm or more and 6 nm or less, and a phase difference between the exposure light transmitted through the light-shielding film and the exposure light transmitted in air for a distance equal to the thickness of the light-shielding film is 30 degrees or less.

Further, a mask blank according to this invention is also for use in the manufacture of a binary mask adapted to be applied with ArF excimer laser exposure light, the mask blank comprising, on a transparent substrate, a light-shielding film for forming a transfer pattern, wherein the light-shielding film has a laminated structure of a light-shielding layer (lower layer) and a front-surface antireflection layer (upper layer) and has an optical density of 2.8 or more for the exposure light and a thickness of 45 nm or less, the light-shielding layer (lower layer) is made of a material having a refractive index n of less than 2.00 and an extinction coefficient k of 2.37 or more and has a thickness of 30 nm or more, the front-surface antireflection layer (upper layer) has a thickness of 3 nm or more and 6 nm or less, and a phase difference between the exposure light transmitted through the light-shielding film and the exposure light transmitted in air for a distance equal to the thickness of the light-shielding film is 30 degrees or less.

According to each structure mentioned above, it is possible to realize and provide a light-shielding film with a reduced EMF bias so that various loads applied to the manufacture of a transfer mask are largely reduced. Further, this light-shielding film with the reduced EMF bias can simultaneously satisfy a condition that the light-shielding film ensures an optical density (2.8 or more) that can prevent sensitization of a resist film on a semiconductor wafer due to leakage light caused by overlapping exposure.

Figure 1:
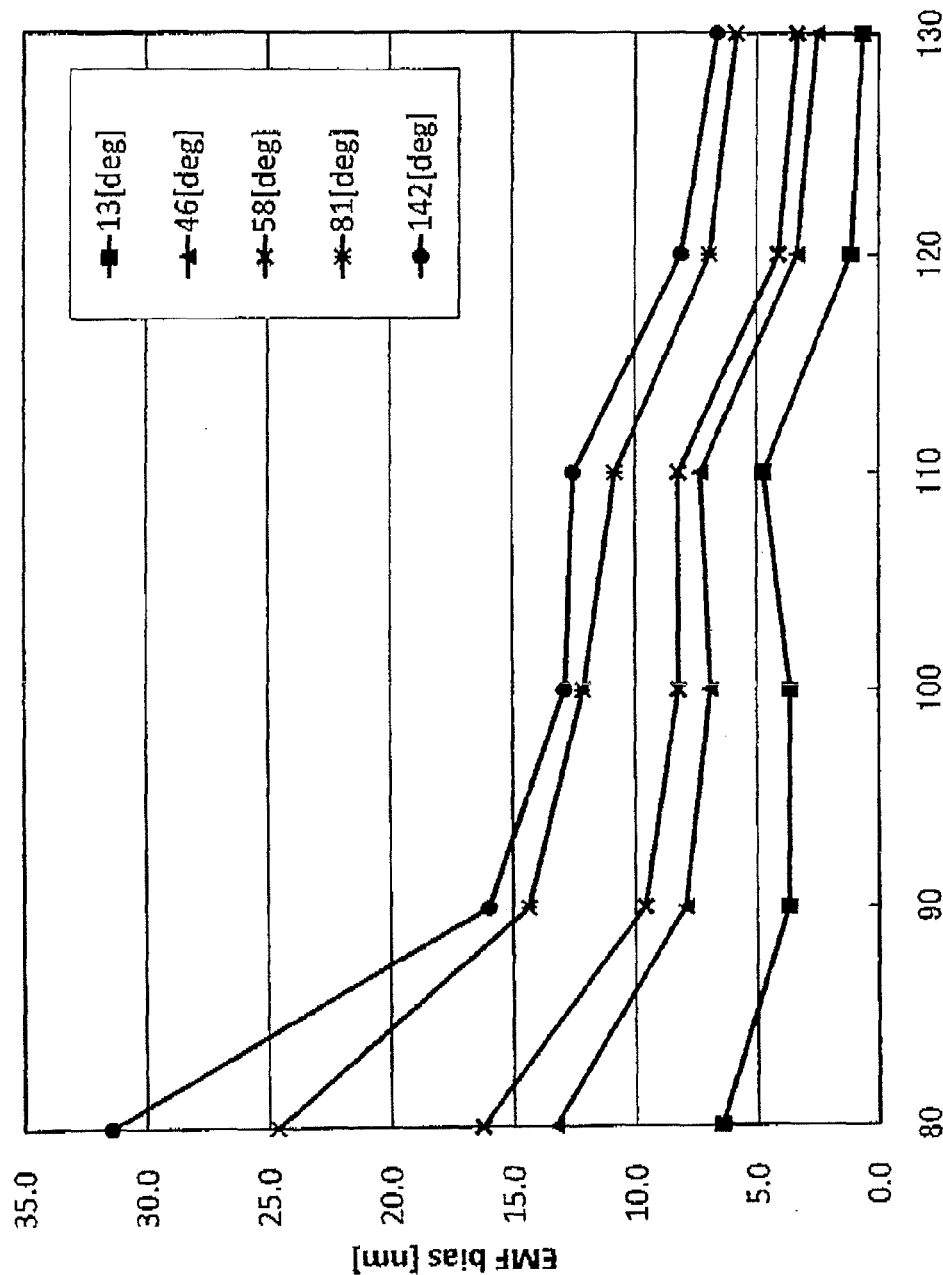
FIG. 1 is a graph showing the relationships between the full pitch of transfer patterns in a plurality of kinds of light-shielding films adapted to produce different phase differences and the EMF bias.

FIG. 1 shows the results of calculating, by simulation, EMF biases that are generated when transfer masks respectively having line & space patterns (transfer patterns) of various pattern pitches in light-shielding films (OD is 2.8 or more) adapted to produce various phase differences were manufactured and the line & space patterns were each exposed and transferred to an object (resist film on a semiconductor wafer, or the like). In this simulation, the calculation was carried out by setting the illumination condition of ArF exposure light to annular illumination. In the graph, the pitch on the abscissa axis represents the full pitch of a line & space pattern to be exposed and transferred to the object.

From FIG. 1, it can be first said that, in the case of any light-shielding film adapted to produce any phase difference, the EMF bias increases as the full pitch of the line & space pattern decreases. In particular, the EMF bias rapidly increases between the full pitches of 90 nm and 80 nm. On the other hand, as the phase difference of the light-shielding film decreases, the EMF bias decreases. In this case, as the pattern pitch width decreases, the reduction degree of the EMF bias is more significant. In particular, in the case of the light-shielding film adapted to produce a small phase difference, the increase degree of the EMF bias is largely improved between the full pitches of 90 nm and 80 nm. From these results, it is clear that the reduction in the phase difference of the light-shielding film largely contributes to the reduction in EMF bias.

In order to form a light-shielding film adapted to produce a small phase difference, it is necessary to use a material with a small refractive index. However, in general, the lightshielding film is provided with a front-surface antireflection layer for suppressing the front-surface reflection for exposure light. As a material of the front-surface antireflection layer, use is made of a material containing a relatively large amount of oxygen and/or nitrogen and thus having a large refractive index. Therefore, under the following conditions, simulation was carried out for EMF biases which are generated when transfer masks each having a transfer pattern in a light-shielding film with a laminated structure of a light-shielding layer and a front-surface antireflection layer were manufactured and the transfer patterns were each exposed and transferred to an object. Simulation of the front-surface reflectance for exposure light was also carried out in parallel. In these simulations, the properties of a material of the front-surface antireflection layers were fixed to a refractive index n of 2.35 and an extinction coefficient k of 0.99, while the thicknesses of the front-surface antireflection layers were set to be different from each other by 2 nm in the range of 0 to 20 nm. As materials of the light-shielding layers, a selection was made of three material/thickness conditions, i.e. Condition 1 (n=1.50, k=2.66, thickness=40 nm), Condition 2 (n=1.50, k=2.14, thickness=50 nm), and Condition 3 (n=2.00, k=2.58, thickness=40 nm), which were respectively simulated. The material and thickness of the light-shielding layer were selected such that a predetermined optical density (OD: 2.8 or more) could be ensured only by the light-shielding layer. A transfer pattern to be exposed and transferred to an object using the transfer mask was a line & space pattern with a full pitch of 80 nm. Accordingly, the space width of the transfer pattern formed in the light-shielding film of the transfer mask is 160 nm as a design value before correction. The illumination condition of ArF exposure light was set to annular illumination.

Figure 2:
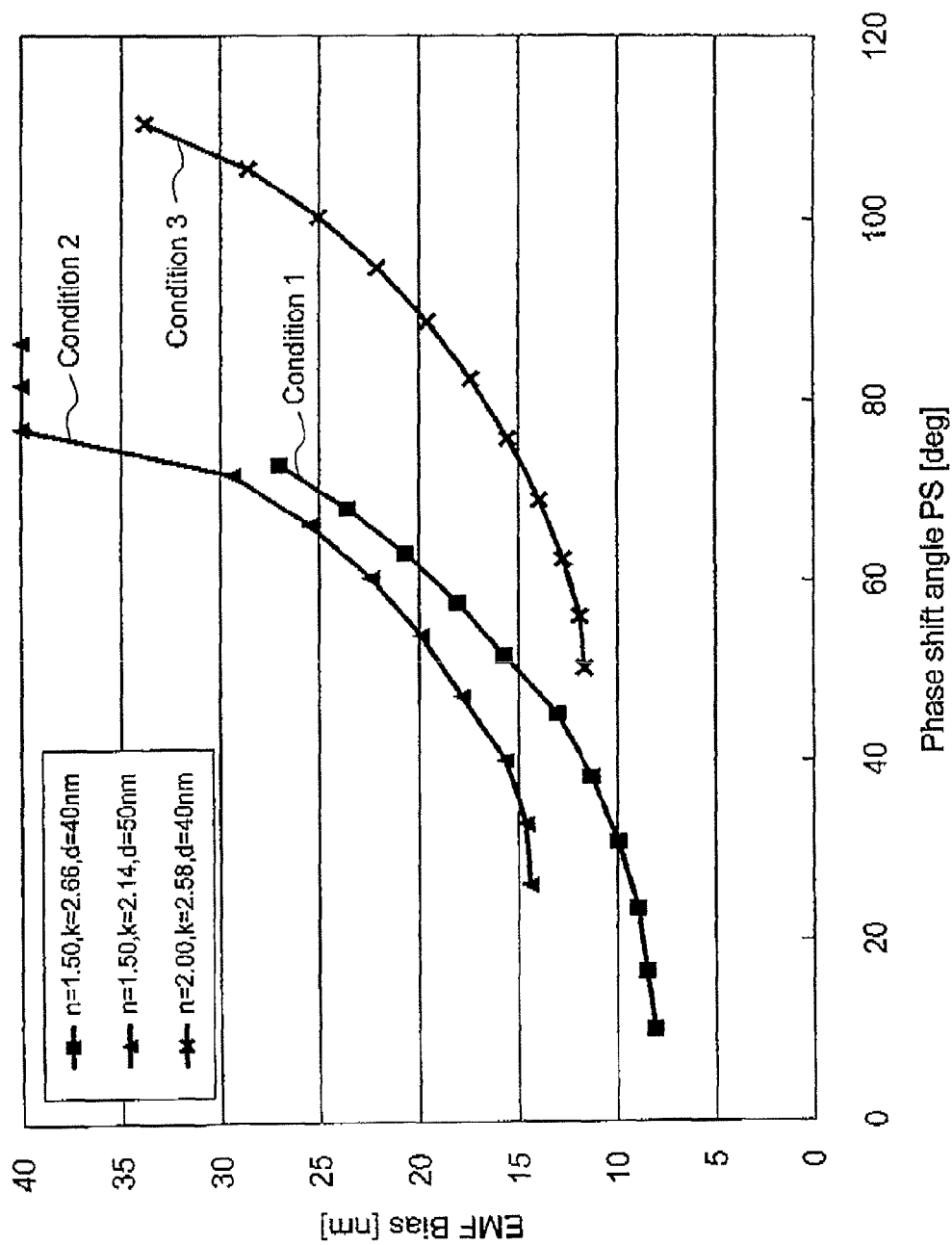
FIG. 2 is a graph showing the relationships between the phase difference of light-shielding films and the EMF bias.

FIG. 2 shows the relationships between the phase difference of the entire light-shielding films and the EMF bias, using the simulation results. From FIG. 2, it is seen that, in the case of using any of Conditions 1 to 3 of the light-shielding layers, the EMF bias decreases as the phase difference over the entire light-shielding film decreases.

Figure 3:
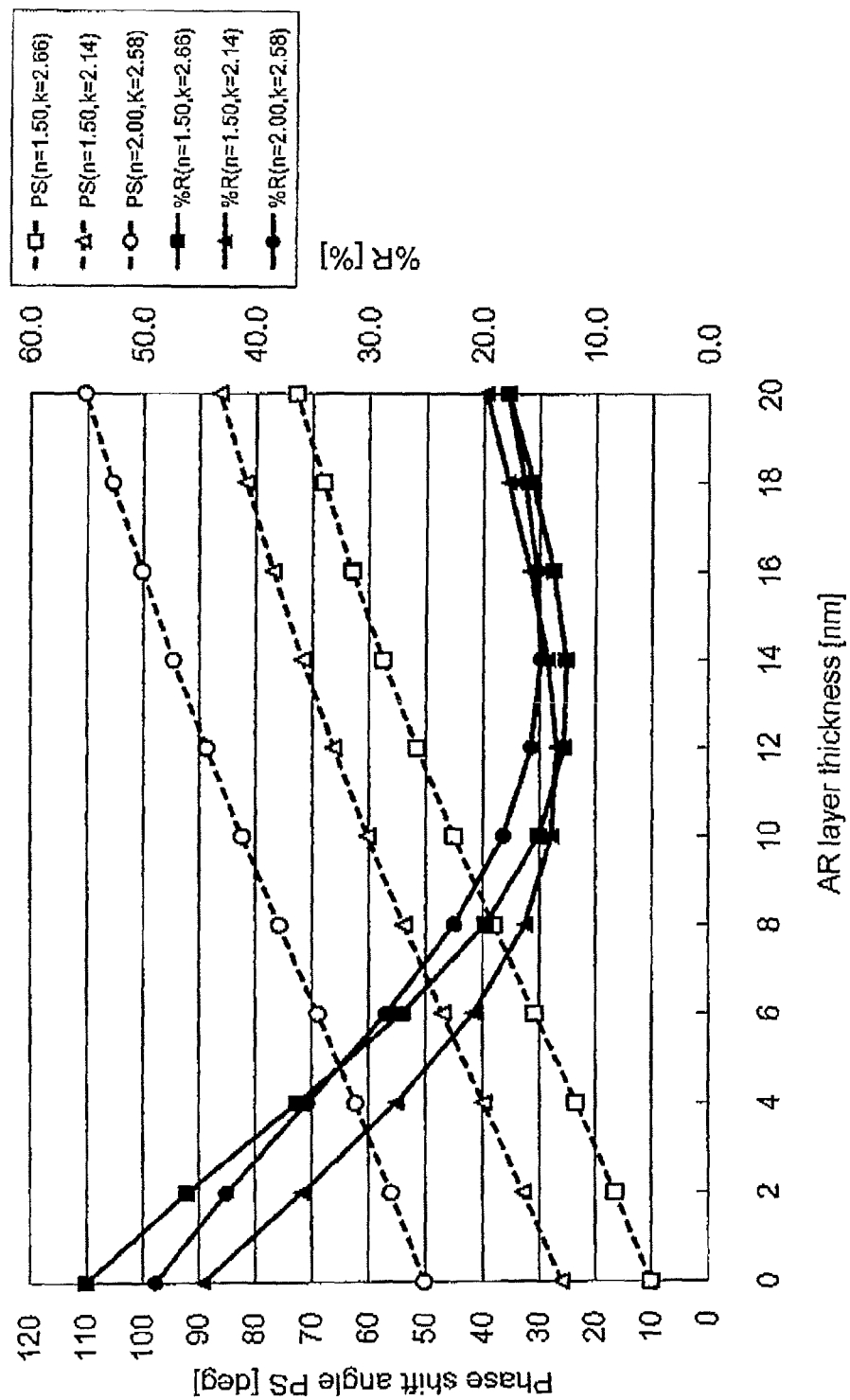
FIG. 3 is a graph showing the relationships between the thickness of front-surface antireflection layers and the phase difference of light-shielding films and the relationships between the thickness of front-surface antireflection layers and the front-surface reflectance for exposure light.

FIG. 3 shows, in one graph, the relationships between the thickness of the front-surface antireflection layers (AR layers) and the phase difference of the entire light-shielding films and the relationships between the thickness of the front-surface antireflection layers and the front-surface reflectance for the exposure light, using the same simulation results. From FIG. 3, it is seen that, in the case of using any of Conditions 1 to 3 of the light-shielding layers, the phase difference over the entire light-shielding film decreases as the thickness of the front-surface antireflection layer decreases.

Figure 4:
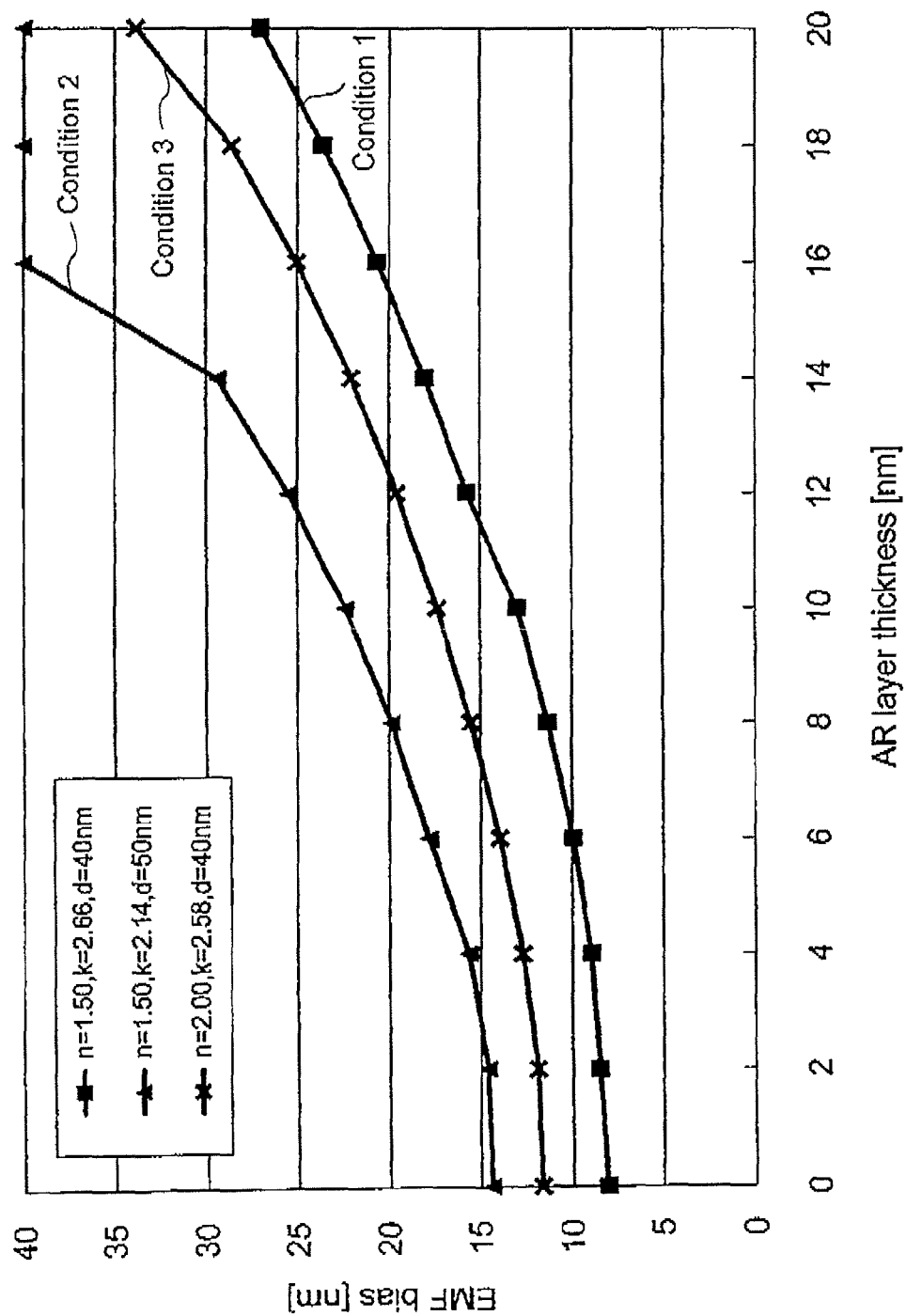
FIG. 4 is a graph showing the relationships between the thickness of front-surface antireflection layers and the EMF bias.

FIG. 4 shows the relationships between the thickness of the front-surface antireflection layers and the EMF bias, using the same simulation results. The EMF bias can be more reduced in the case of the light-shielding film using the light-shielding layer of Condition 1 (n=1.50, 02.66, d=40 nm) than in the case of the light-shielding film using the light-shielding layer of Condition 3 (n=2.00, k=2.58, d=40 nm), regardless of the thickness of the front-surface antireflection layer. From this result, it is seen that the EMF bias can be more reduced using a material with a smaller refractive index n as the light-shielding layer. Although the light-shielding layer of Condition 2 (n=1.50, k=2.14, d=50 nm) has the same refractive index n as the light-shielding layer of Condition 1, the EMF bias is greater than in the case of the light-shielding film using the light-shielding layer of Condition 3 with the higher refractive index n. The thickness of the light-shielding layer of Condition 2 is greater by 10 nm than those of the light-shielding layers of Conditions 1 and 3. From this result, it is seen that the EMF bias can be more reduced as the thickness of the light-shielding layer decreases. The reason that the thickness of the light-shielding layer of Condition 2 is greater than those of the light-shielding layers of Conditions 1 and 3 is for ensuring a predetermined optical density, which is substantially the same as those of the light-shielding layers of Conditions 1 and 3, for the light-shielding layer of Condition 2 because the extinction coefficient k of the light-shielding layer of Condition 2 is low. From these results, it is necessary to select a material with a large extinction coefficient k as the material of the light-shielding layer.

Figure 5:
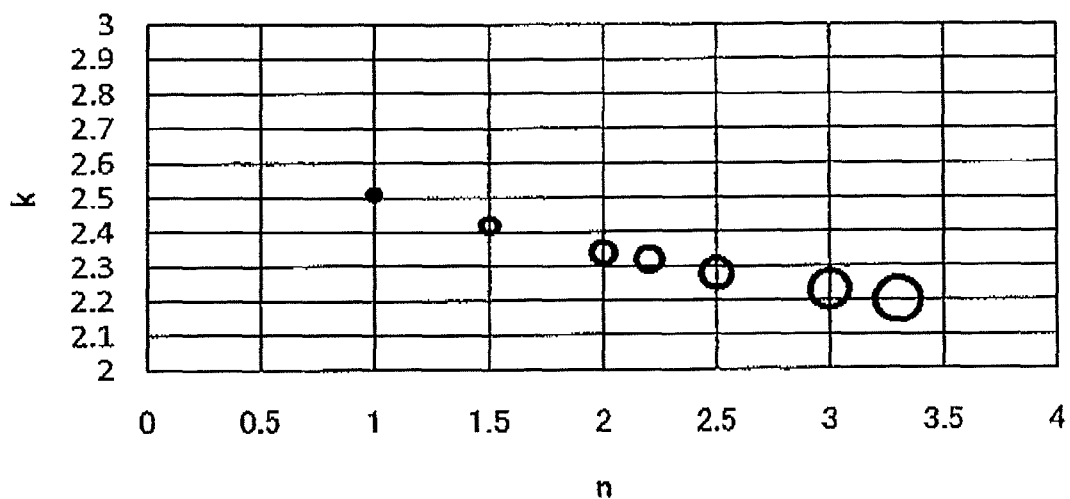
FIG. 5 is a graph showing EMF biases due to refractive indices n and extinction coefficients k of light-shielding layers by sizes of bubbles in the case where the full pitch of a transfer pattern is 80 nm.
Figure 6:
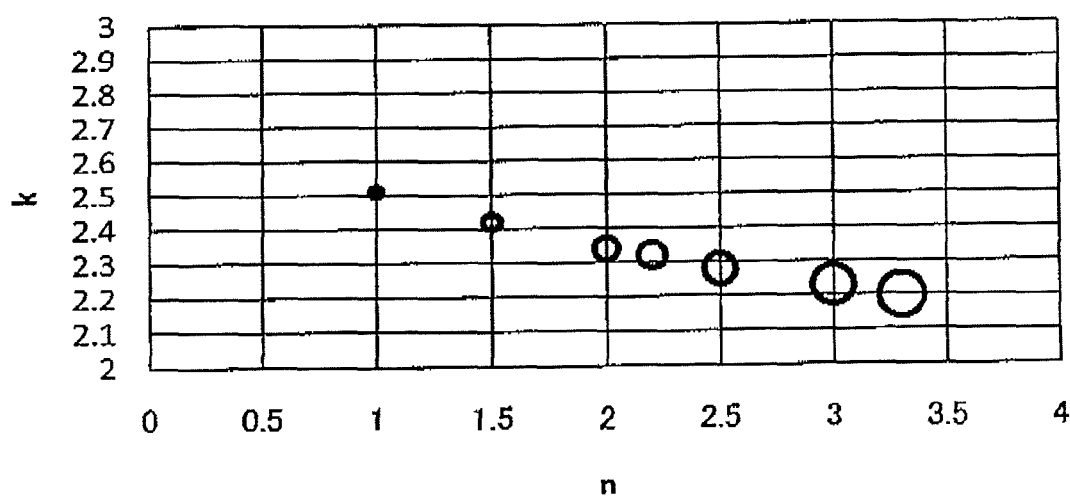
FIG. 6 is a graph showing EMF biases due to refractive indices n and extinction coefficients k of light-shielding layers by sizes of bubbles in the case where the full pitch of a transfer pattern is 100 nm.
Figure 7:
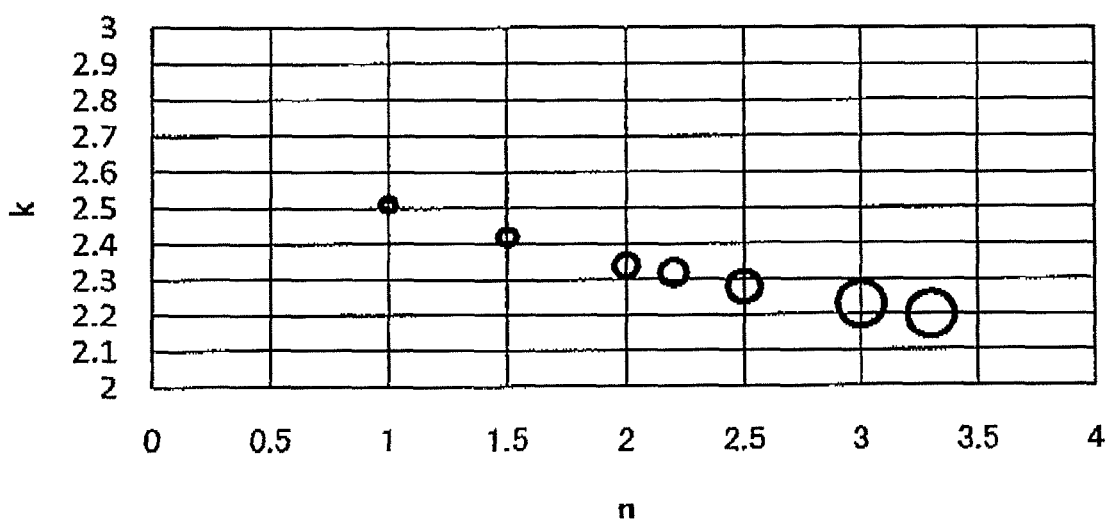
FIG. 7 is a graph showing EMF biases due to refractive indices n and extinction coefficients k of light-shielding layers by sizes of bubbles in the case where the full pitch of a transfer pattern is 120 nm.

Further, simulation was carried out for verifying the influence on an EMF bias only by the difference in the refractive index n and extinction coefficient k of light-shielding layers. As simulation conditions, first, the thickness of the light-shielding layers was fixed to 44 nm and the thickness of front-surface antireflection layers was fixed to 4 nm. The properties of a material of the front-surface antireflection layers were fixed to a refractive index n of 2.35 and an extinction coefficient k of 0.99. The illumination condition of ArF exposure light was set to annular illumination. With respect to seven kinds of light-shielding layers having different refractive indices n and different extinction coefficients k, simulation was carried out using three kinds of line & space patterns with full pitches of 80 nm, 100 nm, and 120 nm, respectively, as transfer patterns to be exposed and transferred to objects. FIGS. 5 to 7 are graphs in which, based on the results of this simulation, differences in EMF bias due to the refractive indices n and extinction coefficients k of the light-shielding layers are shown by sizes of bubbles with respect to the full pitches of 80 nm, 100 nm, and 120 nm, respectively. As the size of the bubble increases, it means that the EMF bias is larger. From these results, it is seen that, regardless of the pitch of the transfer pattern, the EMF bias decreases as the refractive index n of the light-shielding layer decreases or as the extinction coefficient k of the light-shielding layer increases.

In a simplified example, in the case of a line & space pattern with a full pitch of 80 nm, the space width is 40 nm. When an EMF bias is 40 nm, a space portion is lost on an object upon carrying out exposure and transfer, meaning that no pattern is exposed or transferred. Taking into account that the transfer pattern is surely exposed and transferred to the object, the EMF bias is preferably suppressed to ¼ or less of the space width. In the simulation results, shown in FIG. 2, using the line & space pattern with the full pitch of 80 nm, the EMF bias cannot be suppressed to 10 nm or less in the case of Condition 3 where the refractive index n of the light-shielding layer is 2.00 and in the case of Condition 2 where the extinction coefficient k of the light-shielding layer is 2.14. Even in the case of Condition 1 where the refractive index n of the light-shielding layer is 1.50 and the extinction coefficient k of the light-shielding layer is 2.66, unless the phase difference of the light-shielding film is 30 degrees or less, the EMF bias cannot be suppressed to 10 nm or less.

Figure 8:
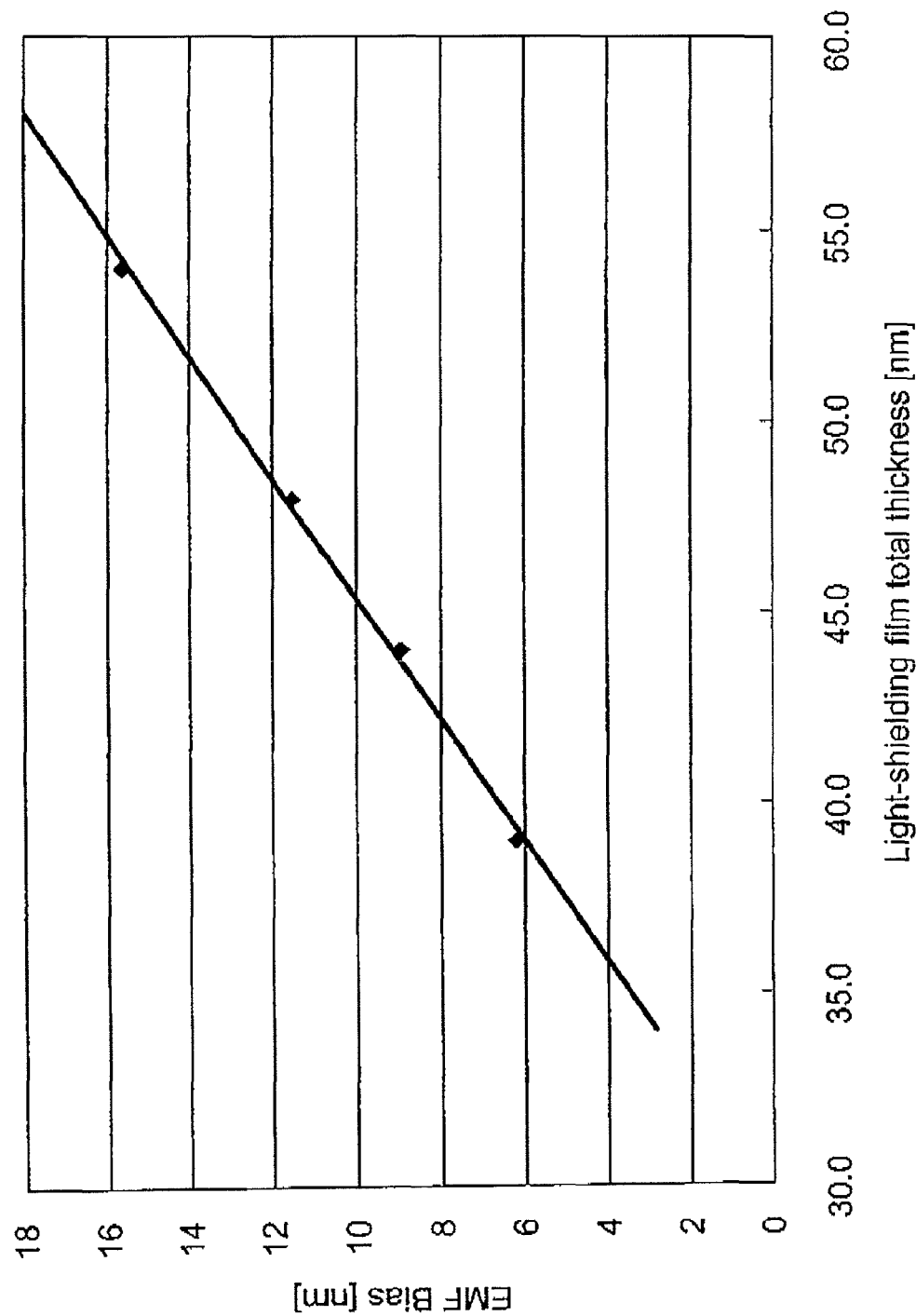
FIG. 8 is a graph showing the relationship between the thickness of light-shielding films and the EMF bias in the case where light-shielding layers have the same refractive index n.

Simulation was carried out for EMF biases in the case of using a material with a refractive index n of 1.50 as light-shielding layers and fixing the material and thickness of front-surface antireflection layers. A transfer pattern to be exposed and transferred to an object was a line & space pattern with a full pitch of 80 nm (space width: 40 nm). The illumination condition of ArF exposure light was set to annular illumination. The results of this simulation are shown in FIG. 8. From FIG. 8, it is seen that, in order to suppress the EMF bias to 10 nm or less, even if the light-shielding layer made of the material with the low refractive index n is used, the thickness of the entire light-shielding film should be set to 45 nm or less.

On the other hand, from the results of FIGS. 3 and 4, it has been found that, in order to satisfy that the phase difference of the light-shielding film is set to 30 degrees or less and that the EMF bias in the case of the line & space pattern with the full pitch of 80 nm is suppressed to 10 nm or less, the thickness of the front-surface antireflection layer should be set to 6 nm or less. Further, from the results of FIG. 3, it has also been found that, in order to suppress the front-surface reflectance of the light-shielding film for exposure light to less than 50%, the thickness of the front-surface antireflection layer should be set to 3 nm or more.

Since the total thickness of the light-shielding film should be set to 45 nm or less and the thickness of the front-surface antireflection layer should be set to 3 nm or more, the thickness of the light-shielding layer should be set to 42 nm or less. In order to provide the front-surface antireflection layer with the function of reducing the front-surface reflectance, the front-surface antireflection layer should be made of a material with a small extinction coefficient k. Therefore, it is preferable that the predetermined optical density (OD) required for the light-shielding film be basically satisfied only by the light-shielding layer.

Figure 9:
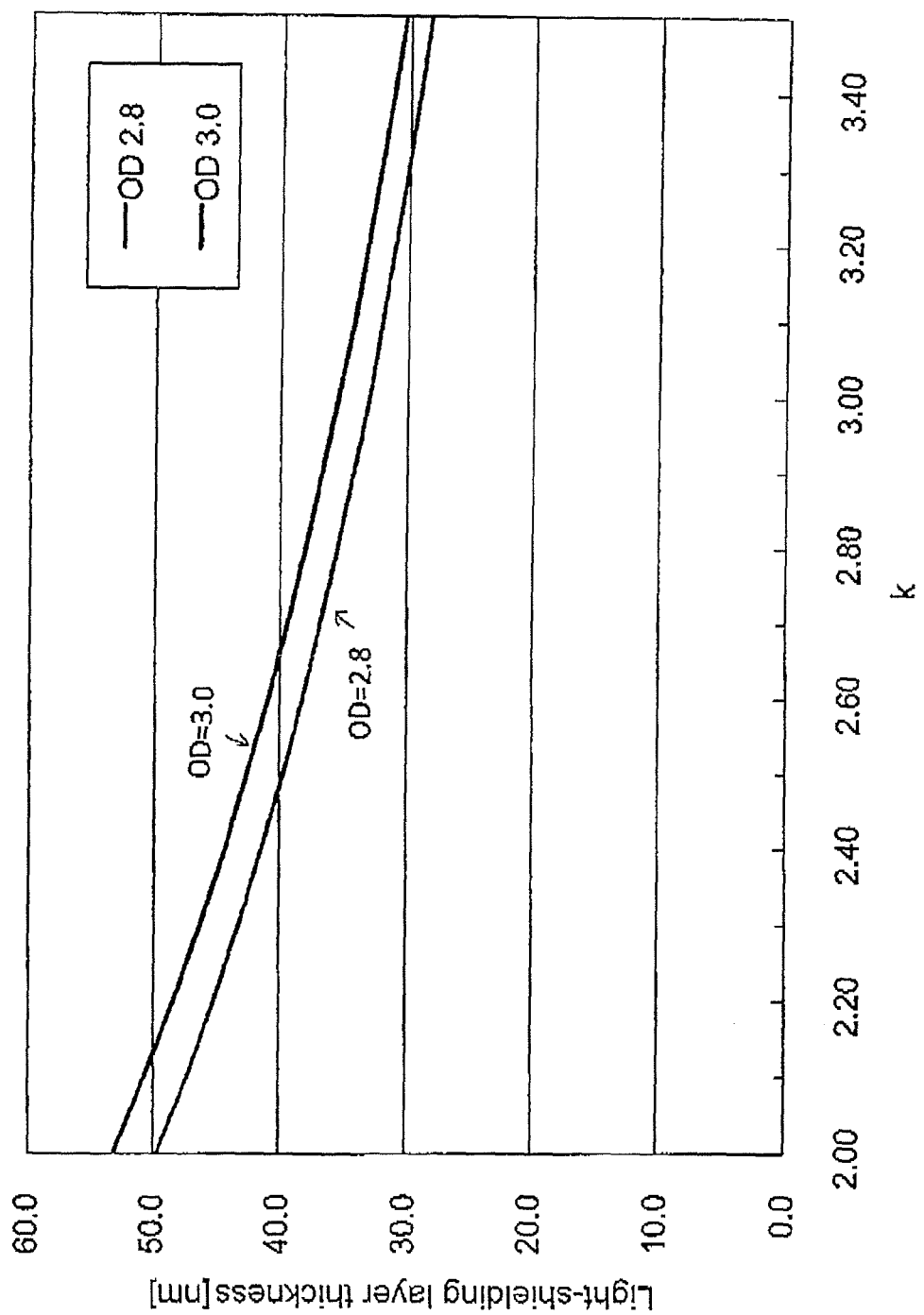
FIG. 9 is a graph showing the relationships between the extinction coefficient k and thickness of light-shielding layers and the optical density thereof.

FIG. 9 shows border lines of predetermined optical densities (OD: 2.8 and 3.0), wherein the abscissa axis represents the extinction coefficient k of the light-shielding layer while the ordinate axis represents the thickness of the light-shielding layer. The light-shielding film preferably has OD 2.8 or more. In order to ensure OD 2.8 or more with the thickness of the light-shielding layer being the upper limit of 42 nm, the extinction coefficient k should be set to 2.37 or more. In order to ensure OD 3.0 or more, the extinction coefficient k should be set to 2.54 or more. On the other hand, when the thickness of the front-surface antireflection layer is set to 6 nm, the upper limit of the thickness of the light-shielding layer should be 39 nm. In this case, in order to ensure OD 2.8 or more by the light-shielding layer, the extinction coefficient k should be set to 2.54 or more. In order to ensure OD 3.0 or more, the extinction coefficient k should be set to 2.73 or more.

When the total thickness of the light-shielding film is 44 nm or less, since the thickness of the front-surface antireflection layer should be set to 3 nm or more, the thickness of the light-shielding layer should be set to 41 nm or less. In this case, in order to ensure OD 2.8 or more, the extinction coefficient k should be set to 2.42 or more. In order to ensure OD 3.0 or more, the extinction coefficient k should be set to 2.58 or more. On the other hand, when the thickness of the front-surface antireflection layer is set to 6 nm, the upper limit of the thickness of the light-shielding layer should be 38 nm. In this case, in order to ensure OD 2.8 or more by the light-shielding layer, the extinction coefficient k should be set to 2.60 or more. In order to ensure OD 3.0 or more, the extinction coefficient k should be set to 2.80 or more.

When the total thickness of the light-shielding film is 42 nm or less, since the thickness of the front-surface antireflection layer should be set to 3 nm or more, the thickness of the light-shielding layer should be set to 39 nm or less. In this case, in order to ensure OD 2.8 or more, the extinction coefficient k should be set to 2.54 or more. In order to ensure OD 3.0 or more, the extinction coefficient k should be set to 2.73 or more. On the other hand, when the thickness of the front-surface antireflection layer is set to 6 nm, the upper limit of the thickness of the light-shielding layer should be 36 nm. In this case, in order to ensure OD 2.8 or more by the light-shielding layer, the extinction coefficient k should be set to 2.75 or more. In order to ensure OD 3.0 or more, the extinction coefficient k should be set to 2.94 or more.

When the total thickness of the light-shielding film is 40 nm or less, since the thickness of the front-surface antireflection layer should be set to 3 nm or more, the thickness of the light-shielding layer should be set to 37 nm or less. In this case, in order to ensure OD 2.8 or more, the extinction coefficient k should be set to 2.67 or more. In order to ensure OD 3.0 or more, the extinction coefficient k should be set to 2.86 or more. On the other hand, when the thickness of the front-surface antireflection layer is set to 6 nm, the upper limit of the thickness of the light-shielding layer should be 34 nm. In this case, in order to ensure OD 2.8 or more by the light-shielding layer, the extinction coefficient k should be set to 2.90 or more. In order to ensure OD 3.0 or more, the extinction coefficient k should be set to 3.10 or more.

The thickness of the light-shielding layer is preferably 30 nm or more. In order to ensure OD 2.8 or more with the thickness of 30 nm, it is necessary to select a material with an extinction coefficient k of 3.30 or more. In particular, in order to ensure OD 3.0 or more, it is necessary to select a material with an extinction coefficient k of 3.50 or more. The materials having such properties are very limited. In order to reduce the thickness of the light-shielding layer to less than 30 nm, it is necessary to find a material with an extinction coefficient k of 3.30 or more, which, however, is difficult.

From the results described above, it is seen that the refractive index n of the light-shielding layer should be less than 2.00. Since the EMF bias can be more reduced as the refractive index n of the light-shielding layer decreases, it is preferably 1.80 or less, more preferably 1.60 or less, and optimally 1.50 or less.

From the results of various studies described above, the refractive index n of the material forming the light-shielding layer should be less than 2.00 and the extinction coefficient k thereof should be 2.37 or more. A material containing a metal and silicon, particularly a material containing a transition metal and silicon, can have such properties. However, it is necessary to reduce as much as possible an element (particularly, oxygen, nitrogen, carbon, hydrogen, or inert gas (helium, argon, xenon)) that is adapted to increase the refractive index n of the light-shielding layer or to reduce the extinction coefficient k of the light-shielding layer. The total content of these elements should be limited to less than 10 at %. Accordingly, the light-shielding layer is preferably made of a material in which the total content of a metal and silicon is 90 at % or more, particularly a material in which the total content of a transition metal and silicon is 90 at % or more.

As described above, this invention is an invention aimed at suppressing an EMF bias by reducing the phase difference over the entire light-shielding film, as compared with conventional, that has not hitherto been paid attention to or controlled in a binary mask or a binary mask blank.

Further, this invention is an invention aimed at suppressing an EMF bias by designing such that the phase difference produced by a front-surface antireflection layer becomes small.

Further, this invention is an invention aimed at suppressing an EMF bias by largely reducing, as compared with conventional, the phase difference produced by a front-surface antireflection layer.

Further, this invention is an invention aimed at suppressing an EMF bias by considerably reducing, as compared with conventional, the thickness of a front-surface antireflection layer.

In this invention, also from the results of FIG. 2 and so on, the phase difference over the entire light-shielding film is preferably 25 degrees or less and more preferably 20 degrees or less in terms of suppressing the EMF bias.

In this invention, the light-shielding film has a laminated structure of a light-shielding layer (lower layer) and a front-surface antireflection layer (upper layer).

Figure 13:
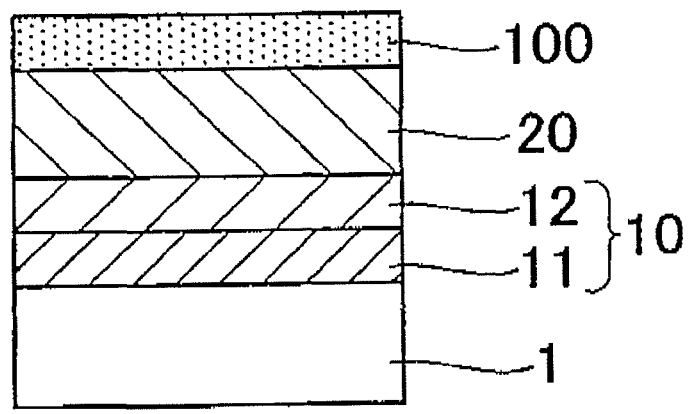
FIG. 13 is an exemplary cross-sectional view showing a mask blank according to an embodiment of this invention.

For example, as shown in FIG. 13, a mask blank of this invention comprises, on a transparent substrate 1, a light-shielding film 10 having a laminated structure of a light-shielding layer (lower layer) 11 and a front-surface antireflection layer (upper layer) 12.

In this invention, in terms of improving the problem of the electromagnetic field (EMF) effect, it is effective to achieve a reduction in thickness by the use of the structure having no back-surface antireflection layer. However, the light-shielding film may have a structure having another layer (e.g. a back-surface antireflection layer) in addition to the light-shielding layer and the front-surface antireflection layer.

In this invention, as a transition metal (M) forming the light-shielding layer, use can be made of one of molybdenum (Mo), tantalum (Ta), chromium (Cr), tungsten (W), titanium (Ti), zirconium (Zr), hafnium (Hf), vanadium (V), niobium (Nb), nickel (Ni), palladium (Pb), iron (Fe), ruthenium (Ru), rhodium (Rh), iridium (Ir), platinum (Pt), zinc (Zn), gold (Au), and silver (Ag), an alloy of two or more of them, or the like.

In this invention, the front-surface antireflection layer should have a thickness of 6 nm or less. In terms of further suppressing the EMF bias, the thickness of the front-surface antireflection layer is preferably 5 nm or less and more preferably 4 nm or less.

In this invention, in terms of providing the front-surface antireflection layer with the antireflection function, the refractive index n of the front-surface antireflection layer should be 2.00 or more. Further, the refractive index n of the front-surface antireflection layer is preferably 2.10 or more and more preferably 2.20 or more.

In this invention, in terms of providing the front-surface antireflection layer with the antireflection function, the extinction coefficient k of the front-surface antireflection layer should be 1.00 or less. Further, the extinction coefficient k of the front-surface antireflection layer is preferably 0.90 or less and more preferably 0.80 or less.

In this invention, the front-surface antireflection layer is a layer formed by deposition for the purpose of preventing the front-surface reflection. In this invention, the front-surface antireflection layer does not have a structure only with a film formed at a surface of the light-shielding film by surface oxidation, a structure only with a film formed at a surface of the light-shielding film by heating, or the like.

In this invention, the front-surface reflectance of the light-shielding film for ArF exposure light should be less than 50% and is preferably 45% or less and more preferably 40% or less.

In this invention, the ratio obtained by dividing the content of the transition metal in the light-shielding layer by the total content of the transition metal and silicon in the light-shielding layer is 42% or less.

In this invention, the transition metal in the light-shielding layer is preferably molybdenum (Mo).

Figure 10:
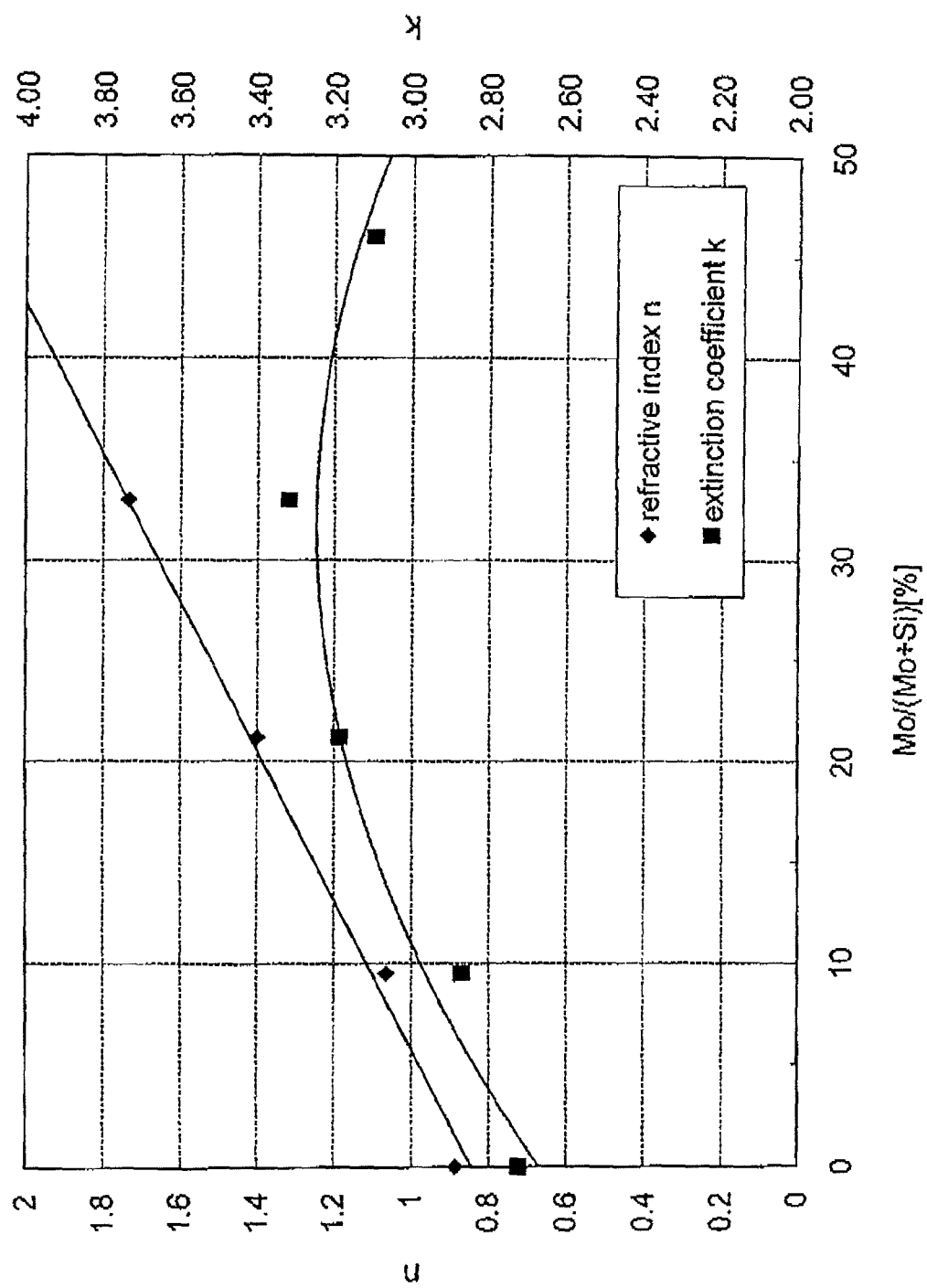
FIG. 10 is a graph showing the relationships between the Mo/(Mo+Si) ratio in molybdenum silicide films and the refractive index n and extinction coefficient k of the films.

FIG. 10 is a graph in which, with respect to molybdenum silicide films each made of molybdenum (Mo) as a transition metal and silicon (Si), refractive indices n and extinction coefficients k of materials having different ratios each obtained by dividing the molybdenum content [at %] in the film by the molybdenum and silicon total content [at %] in the film (i.e. the ratio of the molybdenum content in the film when the molybdenum and silicon total content in the film is given as 100; hereinafter referred to as a "Mo/(Mo+Si) ratio") were measured and plotted. The extinction coefficient k tends to increase to some extent as the Me/(Mo+Si) ratio increases, but to stop increasing on the way (around 33%). On the other hand, the refractive index n tends to increase as the Mo/(Mo+Si) ratio increases to at least 50%. As described above, the material applicable to the light-shielding layer should have a refractive index n of less than 2.00. When molybdenum silicide is used as the material of the light-shielding layer, the Mo/(Mo+Si) ratio should be 42% or less. In order to set the refractive index n of the light-shielding layer to 1.80 or less, the Mo/(Mo+Si) ratio should be set to 35% or less. In order to set the refractive index n of the light-shielding layer to 1.60 or less, the Mo/(Mo+Si) ratio should be set to 27% or less. In order to set the refractive index n of the light-shielding layer to 1.50 or less, the Mo/(Mo+Si) ratio should be set to 23% or less. In the case where elements adapted to increase the refractive index n of the light-shielding layer are contained in the light-shielding layer in an amount of less than 10 at %, it is necessary to reduce the refractive index n by the Mo/(Mo+Si) ratio. In this case, it is preferable that the above-mentioned upper limits of the Mo/(Mo+Si) ratio be reduced by about 8%.

Taking into account the extinction coefficient k of the light-shielding layer, in order to set the extinction coefficient k to 2.75 or more, the Mo/(Mo+Si) ratio should be set to 2% or more from FIG. 10. In order to set the extinction coefficient k to 2.60 or more, the Mo/(Mo+Si) ratio should be set to 4% or more. In order to set the extinction coefficient k to 2.86 or more, the Mo/(Mo+Si) ratio should be set to 6% or more. In order to set the extinction coefficient k to 2.90 or more, the Mo/(Mo+Si) ratio should be set to 7% or more. In order to set the extinction coefficient k to 3.00 or more, the Mo/(Mo+Si) ratio should be set to 11% or more. In order to set the extinction coefficient k to 3.10 or more, the Mo/(Mo+Si) ratio should be set to 16% or more. Herein, the verification was carried out by selecting the molybdenum silicide as a transition metal silicide, but other transition metal silicides also show substantially the same tendency.

In this invention, the front-surface antireflection layer is preferably composed mainly of a material containing a transition metal (M), silicon, and further, at least one element from oxygen and nitrogen, a material containing silicon and, further, at least one element from oxygen and nitrogen, or a material containing a transition metal (M) and, further, at least one element from oxygen and nitrogen. As the transition metal forming the front-surface antireflection layer, any of the above-listed transition metals each usable as the light-shielding layer can be used as it is. This is because, in the case where the light-shielding layer is formed of a material containing the transition metal and silicon, both layers can be dry-etched using the same etching gas and thus excellent etching rate controllability can also be achieved. Further, if the same sputtering target, which is used in the formation of the light-shielding layer, can be used, excellent film formation throughput can be achieved, which is thus more preferable.

In this invention, the front-surface antireflection layer composed mainly of the material containing the transition metal (M), silicon, and further, at least one element from oxygen and nitrogen can be formed of MSiO, MSiN, MSiON, MSiOC, MOCN, MSiOCN, or the like.

In this invention, the front-surface antireflection layer composed mainly of the material containing silicon and, further, at least one element from oxygen and nitrogen can be formed of SiO, SiN, SiON, SiOC, SIGN, SiOCN, or the like.

In this invention, the front-surface antireflection layer composed mainly of the material containing the transition metal (M) and, further, at least one element from oxygen and nitrogen can be formed of MO, MN, MON, MOC, MCN, MOCN, or the like.

A material composed mainly of Ta (TaO, TaON, TaBO, TaBON, or the like) is preferable as the front-surface antireflection layer.

The front-surface antireflection layer made of tantalum oxide containing 50 at % or more oxygen is preferable because it is excellent in antireflection effect.

In this invention, the transition metal in the front-surface antireflection layer is preferably molybdenum (Mo). This is because there is an advantage such that when the transition metal in the light-shielding layer is molybdenum (Mo), the front-surface antireflection layer can be formed using the same sputtering target used for the light-shielding layer.

In this invention, the light-shielding layer made of Mo and Si is freely controllable in tensile stress and compressive stress by the gas pressure in a sputtering chamber and a heat treatment. For example, by controlling the film stress of the light-shielding layer made of Mo and Si to be a tensile stress, it is possible to achieve balance with the compressive stress of the front-surface antireflection layer (e.g. MoSION). That is, it is possible to cancel the stresses of the respective layers forming the light-shielding film and thus to reduce the film stress of the light-shielding film as much as possible (to substantially zero).

In this invention, as the front-surface antireflection layer, use can be made of MoSiON, MoSiO, MoSiN, MoSiOC, MoSiOCN, or the like.

In this invention, if Mo is increased in amount in MoSiON, MoSiO, MoSiN, MoSiOC, MoSiOCN, or the like being the front-surface antireflection layer, the cleaning resistance, particularly the resistance to alkali (aqueous ammonia, etc.) or hot water, decreases. From this point of view, it is preferable to minimize Mo in MoSiON, MoSiO, MoSiN, MoSiOC, MoSiOCN, or the like being the front-surface antireflection layer.

It has been found that, upon carrying out a heat treatment (annealing) at a high temperature for the purpose of stress control, if the Mo content is high, a phenomenon that a film surface is clouded white (becomes cloudy) occurs. This is considered to be because MoO is precipitated on the surface. In terms of avoiding such a phenomenon, the content of Mo in MoSiON, MoSiO, MoSiN, MoSiOC, MoSiOCN, or the like being the front-surface antireflection layer is preferably less than 10 at %. However, if the Mo content is too low, abnormal discharge becomes significant in DC sputtering so that the defect occurrence frequency increases. Therefore, it is preferable to contain Mo in a range capable of carrying out sputtering normally. According to another film forming technique, there is a case where the film formation is enabled without containing Mo.

The mask blank of this invention is applicable to a binary mask blank for use in single exposure, double patterning, or double exposure.

The double patterning is a technique that carries out twice a series of processes of resist coating, exposure, development, and resist stripping with respect to a semiconductor wafer, thereby carrying out patterning. That is, exposure of a transfer pattern is carried out once with respect to a resist film on the wafer in the same manner as conventional single exposure, wherein overlapping exposure portions are subjected to exposure of four times at maximum due to leakage light.

The double exposure is a technique that carries out exposure of a transfer pattern onto a resist film on a semiconductor wafer using a first transfer mask and then carries out exposure of a transfer pattern onto the same resist film using a second transfer mask.

A method of manufacturing a transfer mask according to this invention comprises an etching step of patterning, by etching, the light-shielding film in any of the mask blanks having the above-mentioned structures.

A binary transfer mask of this invention is adapted to be applied with ArF excimer laser exposure light, the transfer mask comprising, on a transparent substrate, a light-shielding film having a transfer pattern, wherein the light-shielding film has a laminated structure of a light-shielding layer (lower layer) and a front-surface antireflection layer (upper layer) and has an optical density of 2.8 or more for the exposure light and a thickness of 45 nm or less, the light-shielding layer (lower layer) is made of a material in which the total content of a transition metal and silicon is 90 at % or more, and has a thickness of 30 nm or more, the front-surface antireflection layer (upper layer) has a thickness of 3 nm or more and 6 nm or less, and a phase difference between the exposure light transmitted through the light-shielding film and the exposure light transmitted in air for a distance equal to the thickness of the light-shielding film is 30 degrees or less.

A binary transfer mask of this invention is also adapted to be applied with ArF excimer laser exposure light, the transfer mask comprising, on a transparent substrate, a light-shielding film having a transfer pattern, wherein the light-shielding film has a laminated structure of a light-shielding layer (lower layer) and a front-surface antireflection layer (upper layer) and has an optical density of 2.8 or more for the exposure light and a thickness of 45 nm or less, the light-shielding layer (lower layer) is made of a material having a refractive index n of less than 2.00 and an extinction coefficient k of 2.37 or more and has a thickness of 30 nm or more, the front-surface antireflection layer (upper layer) has a thickness of 3 nm or more and 6 nm or less, and a phase difference between the exposure light transmitted through the light-shielding film and the exposure light transmitted in air for a distance equal to the thickness of the light-shielding film is 30 degrees or less.

According to the above-mentioned structure, using the mask blank having the light-shielding film with a reduced EMF bias, various loads applied to the manufacture of a transfer mask are largely reduced. Further, the obtained transfer mask can simultaneously satisfy a condition that the light-shielding film ensures an optical density that can prevent sensitization of a resist film on a semiconductor wafer due to leakage light caused by overlapping exposure.

The transfer mask of this invention is applicable to a transfer mask for use in single exposure, double patterning, or double exposure.

In this invention, as shown in FIG. 13, it is preferable to provide, on the light-shielding film 10, an etching mask film 20 made of a material having high etching selectivity to a material of the light-shielding film 10. The line width of a transfer pattern to be formed in the light-shielding film 10 is as very small as 40 nm in half-pitch in the case of a line & space pattern. If such a fine pattern is formed in a resist film 100 of an organic material for directly dry-etching the light-shielding film 10 using the pattern of the resist film 100 as a mask, there is a problem that the thickness of the resist film 100 becomes too large, so that the pattern transfer accuracy is largely degraded. In view of this, if the fine pattern formed in the resist film 100 is transferred, by dry etching, to the thin etching mask film 20 and, using as a mask the etching mask film 20 formed with a transfer pattern, the light-shielding film 10 is dry-etched for pattern transfer, a transfer pattern can be formed in the light-shielding film 10 with high accuracy. In the case where the light-shielding film 10 is dry-etched using a fluorine-based gas, a material containing chromium having high etching selectivity is preferable as the material of the etching mask film 20. The material containing chromium is normally dry-etched using a mixed gas of chlorine-based gas and oxygen, In order to improve the etching rate in dry etching of the etching mask film 20 made of the material containing chromium, the content of chromium in the etching mask film 20 is preferably 45 at % or less, further preferably 40 at % or less, and more preferably 35 at % or less.

In this invention, for dry-etching a thin film containing a transition metal and silicon or a thin film containing a transition metal, use can be made of, for example, a fluorine-based gas such as $SF_6$, $CF_4$, $C_2F_6$, or $CHF_3$, a mixed gas of such a fluorine-based gas and He, $H_2$, $N_2$, Ar, $C_2H_4$, $O_2$ or the like, a chlorine-based gas such as $Cl_2$ or $CH_2Cl_2$, or a mixed gas of such a chlorine-based gas and He, $H_2$, $N_2$, Ar, $C_2H_4$, or the like.

In this invention, the resist is preferably a chemically amplified resist. The reason is that the chemically amplified resist is suitable for high-accuracy processing.

This invention is applied to mask blanks of the generations aimed at a resist film thickness of 100 nm or less, a resist film thickness of 75 nm or less, and further a resist film thickness of 50 nm.

In this invention, the resist may alternatively be a resist for electron beam writing. The reason is that the resist for electron beam writing is also suitable for high-accuracy processing.

This invention is applied to an electron beam writing mask blank adapted to be formed with a resist pattern by electron beam writing.

In this invention, as the transparent substrate, use can be made of a synthetic quartz substrate, a $CaF_2$ substrate, a soda-lime glass substrate, an alkali-free glass substrate, a low thermal expansion glass substrate, an aluminosilicate glass substrate, or the like.

In this invention, the mask blank may be a binary mask blank or a resist-coated mask blank.

In this invention, the transfer mask may be a binary mask which does not use the phase shift effect, or may be a reticle. In this invention, an enhancer mask and a phase shift mask are not included.

A method of manufacturing a semiconductor device according to this invention is characterized by forming a circuit pattern on a semiconductor wafer using the binary transfer mask according to any of the above-mentioned Structures.

Further, the method of manufacturing the semiconductor device of this invention is characterized in that the circuit pattern formed on the semiconductor wafer includes a line & space pattern of half-pitch 40 nm or less, The transfer mask of this invention is excellent in transfer accuracy of a line & space pattern of half-pitch 40 nm or less and is most suitable for forming on a semiconductor wafer a circuit pattern having a line & space pattern of half-pitch 40 nm or less.

EXAMPLES

Hereinbelow, this invention will be described in more detail with reference to Examples.

Example 1

Manufacture of Mask Blank

As shown in FIG. 13, using a synthetic quartz glass substrate having a 6-inch square size with a thickness of 0.25 inches as a transparent substrate 1, a MoSiN film (light-shielding layer 11: lower layer) and a MoSiON film (front-surface antireflection layer 12: upper layer) were formed in this order as a light-shielding film 10 on the transparent substrate 1.

Specifically, using a mixed target of molybdenum (Mo) and silicon (Si) (Mo:Si=21 at %:79 at %), reactive sputtering (DC sputtering) was carried out in a mixed gas atmosphere of argon (Ar) and nitrogen ($N_2$), thereby forming the light-shielding layer 11 (MoSiN film, N=about 5 at %) to a thickness of 35 nm on the transparent substrate 1.

Then, using a mixed target of molybdenum (Mo) and silicon (Si) (Mo:Si=4 at %:96 at %), reactive sputtering (DC sputtering) was carried out in a mixed gas atmosphere of argon (Ar), oxygen ($O_2$), and nitrogen ($N_2$), thereby forming the front-surface antireflection layer 12 (MoSiON film) to a thickness of 4 nm on the light-shielding layer 11.

The total thickness of the light-shielding film 10 was set to 39 nm. The optical density (OD) of the light-shielding film 10 was 3.03 at the wavelength 193 nm of ArF excimer laser exposure light.

The front-surface reflectance of the light-shielding film 10 was 41.9%. The transmittance and the reflectance were measured using a spectrophotometer.

The MoSiN film (light-shielding layer 11: lower layer) had a refractive index n of 1.50 and an extinction coefficient k of 3.06.

The MoSiON film (front-surface antireflection layer 12: upper layer) had a refractive index n of 2.28 and an extinction coefficient k of 0.92.

(Heat Treatment after Film Formation)

Then, the above-mentioned substrate was heat-treated (annealed) at 450° C. for 30 minutes.

(Evaluation)

The phase difference (phase shift angle) between exposure light transmitted through the light-shielding film 10 and exposure light transmitted in air for a distance equal to the thickness of the light-shielding film 10 was examined and, as a result, it was 13 degrees.

Figure 11:
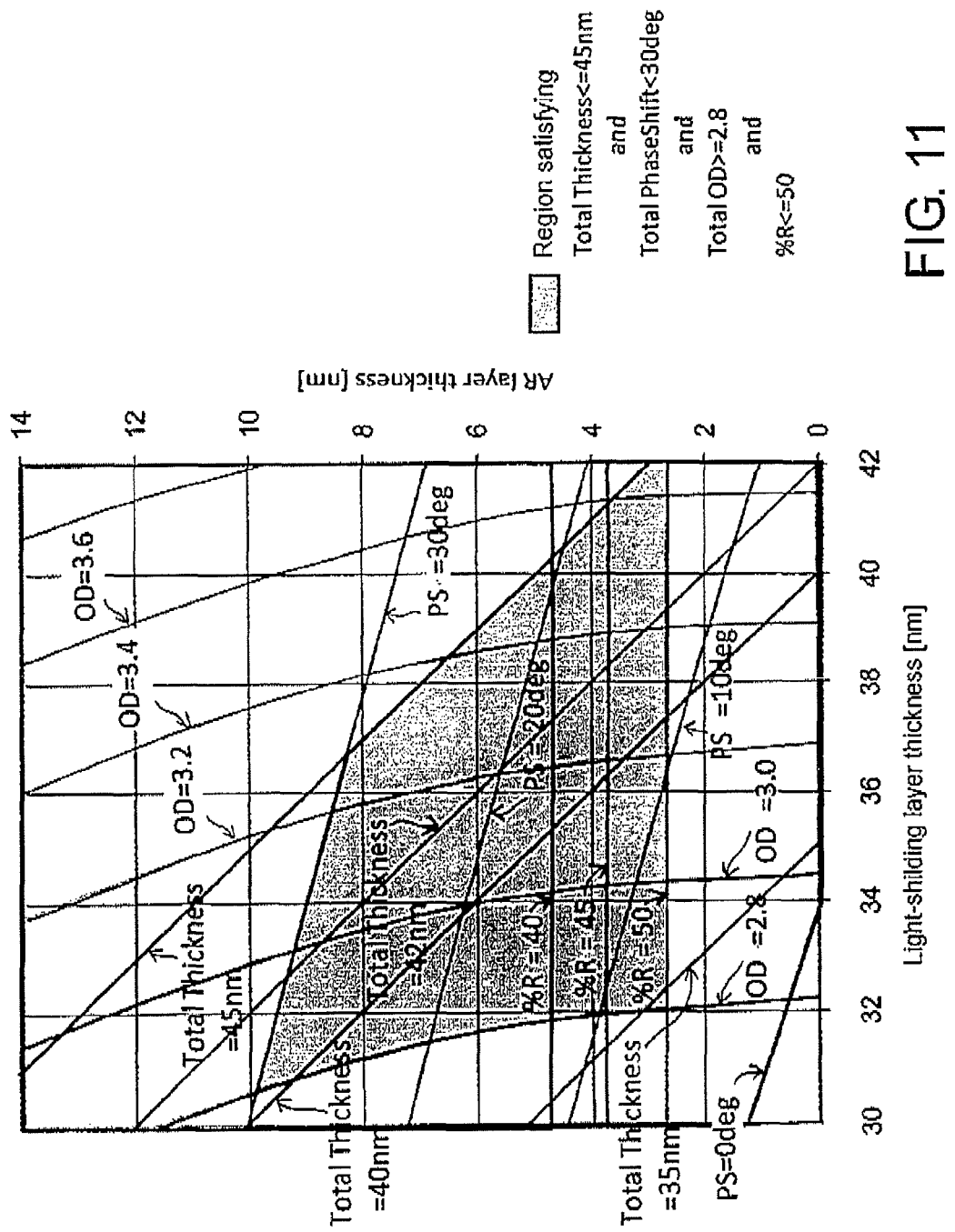
FIG. 11 is a graph showing the results of examining how the total thickness, the total phase shift amount, the total OD, and the front-surface reflectance respectively change when the upper layer thickness and the lower layer thickness of a light-shielding film are respectively changed in Example 1 of this invention.

FIG. 11 is a graph showing the results of examining how the total thickness, the total phase shift amount, the total OD, and the front-surface reflectance respectively change when the upper layer thickness and the lower layer thickness are respectively changed in Example 1.

From FIG. 11, it is seen that it is necessary to synthetically study and consider the upper layer thickness (AR layer thickness), the lower layer thickness (light-shielding layer thickness), the total thickness, the total phase shift amount, the total OD, and the front-surface reflectance (% R).

Before manufacturing a binary transfer mask adapted to be applied with ArF exposure light and having a transfer pattern including a line & space pattern (L&S) of DRAM half-pitch (hp) 40 nm according to the semiconductor device design rule, simulation for examining an EMF bias was carried out using a mask blank of Example 1. As a result, the EMF bias was 6.2 nm in the case of annular illumination and was −0.3 nm in the case of dipole illumination.

Example 2

Manufacture of Mask Blank

As shown in FIG. 13, using a synthetic quartz glass substrate having a 6-inch square size with a thickness of 0.25 inches as a transparent substrate 1, a MoSi film (light-shielding layer 11: lower layer) and a MoSiON film (front-surface antireflection layer 12: upper layer) were formed in this order as a light-shielding film 10 on the transparent substrate 1.

Specifically, using a mixed target of molybdenum (Mo) and silicon (Si) (Mo:Si=9.5 at %:89.5 at %), sputtering (DC sputtering) was carried out in an argon (Ar) gas atmosphere, thereby forming the light-shielding layer 11 (MoSi film) to a thickness of 38 nm on the transparent substrate 1.

Then, using a mixed target of molybdenum (Mo) and silicon (Si) (Mo:Si=4 at %:96 at %), reactive sputtering (DC sputtering) was carried out in a mixed gas atmosphere of argon (Ar), oxygen ($O_2$), and nitrogen ($N_2$), thereby forming the front-surface antireflection layer 12 (MoSiON film) to a thickness of 4 nm on the light-shielding layer 11.

The total thickness of the light-shielding film 10 was set to 42 nm. The optical density (OD) of the light-shielding film 10 was 3.0 at the wavelength 193 nm of ArF excimer laser exposure light.

The front-surface reflectance of the light-shielding film 10 was 39.6%. The transmittance and the reflectance were measured using a spectrophotometer.

The MoSi film (light-shielding layer 11: lower layer) had a refractive index n of 1.24 and an extinction coefficient k of 2.77.

The MoSiON film (front-surface antireflection layer 12: upper layer) had a refractive index n of 2.28 and an extinction coefficient k of 0.92.

(Heat Treatment after Film Formation)

Then, the above-mentioned substrate was heat-treated (annealed) at 450° C. for 30 minutes.

(Evaluation)

The phase difference (phase shift angle) between exposure light transmitted through the light-shielding film 10 and exposure light transmitted in air for a distance equal to the thickness of the light-shielding film 10 was examined and, as a result, it was 1.1 degrees.

Figure 12:
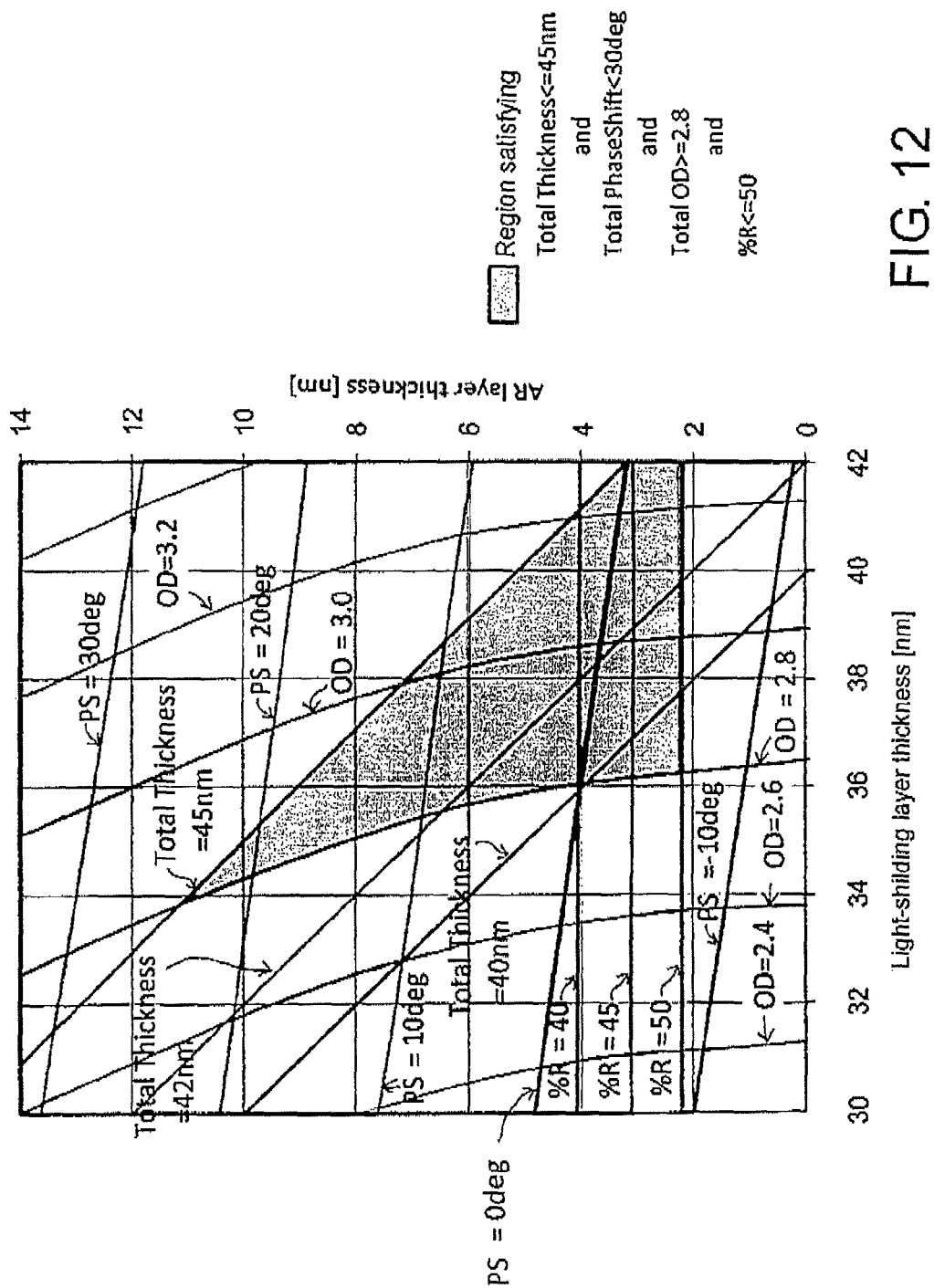
FIG. 12 is a graph showing the results of examining how the total thickness, the total phase shift amount, the total OD, and the front-surface reflectance respectively change when the upper layer thickness and the lower layer thickness of a light-shielding film are respectively changed in Example 2 of this invention.

FIG. 12 is a graph showing the results of examining how the total thickness, the total phase shift amount, the total OD, and the front-surface reflectance respectively change when the upper layer thickness and the lower layer thickness are respectively changed in Example 2.

From FIG. 12, it is seen that it is necessary to synthetically study and consider the upper layer thickness, the lower layer thickness, the total thickness, the total phase shift amount, the total OD, and the front-surface reflectance.

Before manufacturing a binary transfer mask adapted to be applied with ArF exposure light and having a transfer pattern including L&S of DRAM half-pitch (hp) 40 nm according to the semiconductor device design rule, simulation for examining an EMF bias was carried out using a mask blank of Example 2. As a result, the EMF bias was 6.0 nm in the case of annular illumination and was −0.5 nm in the case of dipole illumination.

Example 3

Manufacture of Mask Blank

As shown in FIG. 13, using a synthetic quartz glass substrate having a 6-inch square size with a thickness of 0.25 inches as a transparent substrate 1, a MoSi film (light-shielding layer 11: lower layer) and a MoSiON film (front-surface antireflection layer 12: upper layer) were formed in this order as a light-shielding film 10 on the transparent substrate 1.

Specifically, using a mixed target of molybdenum (Mo) and silicon (Si) (Mo:Si=9.5 at %:89.5 at %), sputtering (DC sputtering) was carried out in an argon (Ar) gas atmosphere, thereby forming the light-shielding layer 11 (MoSi film) to a thickness of 39 nm on the transparent substrate 1.

Then, using a mixed target of molybdenum (Mo) and silicon (Si) (Mo:Si=4 at %:96 at %), reactive sputtering (DC sputtering) was carried out in a mixed gas atmosphere of argon (Ar), oxygen ($O_2$), and nitrogen ($N_2$), thereby forming the front-surface antireflection layer 12 (MoSiON film) to a thickness of 6 nm on the light-shielding layer 11.

The total thickness of the light-shielding film 10 was set to 45 nm. The optical density (OD) of the light-shielding film 10 was 3.04 at the wavelength 193 nm of ArF excimer laser exposure light.

The front-surface reflectance of the light-shielding film 10 was 29.8%. The transmittance and the reflectance were measured using a spectrophotometer.

The MoSi film (light-shielding layer 11: lower layer) had a refractive index n of 1.24 and an extinction coefficient k of 2.77.

The MoSION film (front-surface antireflection layer 12: upper layer) had a refractive index n of 2.28 and an extinction coefficient k of 0.92.

(Heat Treatment after Film Formation)

Then, the above-mentioned substrate was heat-treated (annealed) at 450° C. for 30 minutes.

(Evaluation)

The phase difference (phase shift angle) between exposure light transmitted through the light-shielding film 10 and exposure light transmitted in air for a distance equal to the thickness of the light-shielding film 10 was examined and, as a result, it was 9.5 degrees.

Before manufacturing a binary transfer mask adapted to be applied with ArF exposure light and having a transfer pattern including L&S of DRAM half-pitch (hp) 40 nm according to the semiconductor device design rule, simulation for examining an EMF bias was carried out using a mask blank of Example 3. As a result, the EMF bias was 7.4 nm in the case of annular illumination and was −0.1 nm in the case of dipole illumination.

Comparative Example 1

Manufacture of Mask Blank

As shown in FIG. 13, using a synthetic quartz glass substrate having a 6-inch square size with a thickness of 0.25 inches as a transparent substrate 1, a MoSiN film (light-shielding layer 11) and a MoSiON film (front-surface antireflection layer 12) were formed in this order as a light-shielding film 10 on the transparent substrate 1.

Specifically, using a mixed target of molybdenum (Mo) and silicon (Si) (Mo:Si=21 at %:79 at %), reactive sputtering (DC sputtering) was carried out in a mixed gas atmosphere of argon (Ar) and nitrogen ($N_2$), thereby forming the light-shielding layer 11 (MoSiN film) to a thickness of 50 nm on the transparent substrate 1.

Then, using a mixed target of molybdenum (Mo) and silicon (Si) (Mo:Si=4 at %:96 at %), reactive sputtering (DC sputtering) was carried out in a mixed gas atmosphere of argon (Ar), oxygen ($O_2$), and nitrogen ($N_2$), thereby forming the front-surface antireflection layer 12 (MoSiON film) to a thickness of 10 nm on the light-shielding layer 11.

The elements of the respective layers were analyzed by the Rutherford backscattering spectrometry.

The total thickness of the light-shielding film 10 was set to 60 nm. The optical density (OD) of the light-shielding film 10 was 3.0 at the wavelength 193 nm of ArF excimer laser exposure light.

The front-surface reflectance of the light-shielding film 10 was 21.3%. The transmittance and the reflectance were measured using a spectrophotometer.

The MoSiN film (light-shielding layer 11) had a refractive index n of 2.42 and an extinction coefficient k of 1.91.

The MoSiON film (front-surface antireflection layer 12) had a refractive index n of 2.31 and an extinction coefficient k of 1.00.

(Heat Treatment after Film Formation)

Then, the above-mentioned substrate was heat-treated (annealed) at 450° C. for 30 minutes.

(Evaluation)

The phase difference (phase shift angle) between exposure light transmitted through the light-shielding film 10 and exposure light transmitted in air for a distance equal to the thickness of the light-shielding film 10 was examined and, as a result, it was 143 degrees.

Before manufacturing a binary transfer mask adapted to be applied with ArF exposure light and having a transfer pattern including L&S of DRAM half-pitch (hp) 40 nm according to the semiconductor device design rule, simulation for examining an EMF bias was carried out using a mask blank of Comparative Example 1. As a result, the EMF bias was 23.8 nm in the case of annular illumination and was 4.0 nm in the case of dipole illumination. In the case of annular illumination, the EMF bias becomes 20 nm or more and thus effective bias correction cannot be carried out. That is, it has been seen that, with the mask blank of Comparative Example 1, a transfer pattern including L&S of DRAM half-pitch (hp) 40 nm cannot be formed for a transfer mask which is subjected to annular illumination.

(Manufacture of Transfer Mask)

Figure 14:
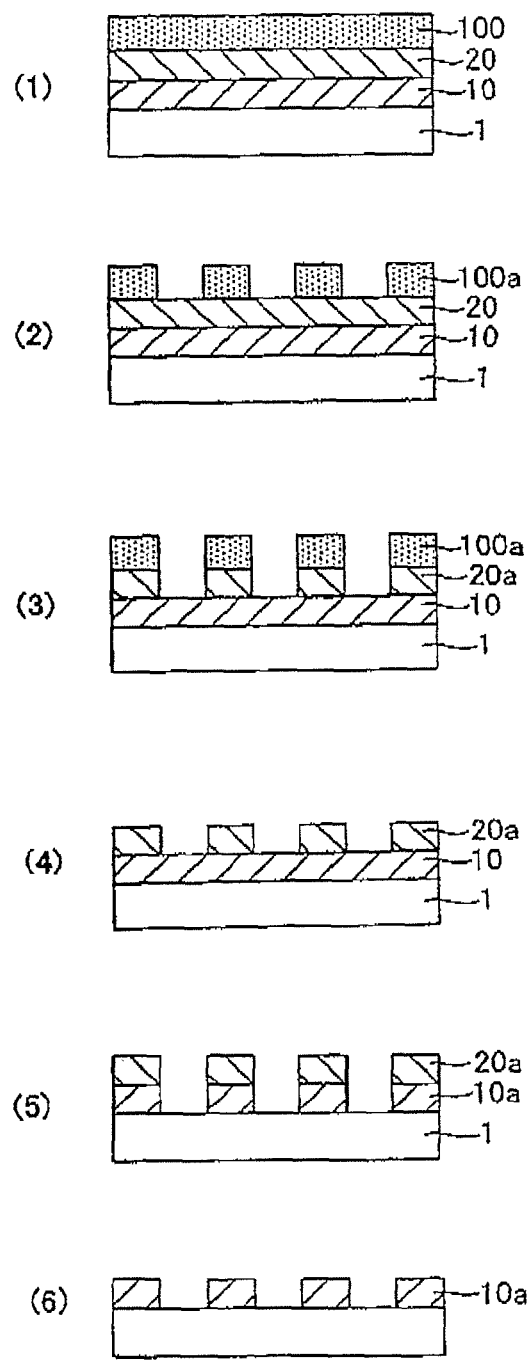
FIG. 14 shows exemplary cross-sectional views for explaining manufacturing processes of a transfer mask according to an Example of this invention.

Referring to FIGS. 13 and 14, an etching mask film 20 was formed on each of the mask blanks obtained in Examples 1 to 3. Specifically, using a chromium target, sputtering (DC sputtering) was carried out in a mixed gas atmosphere of argon (Ar), carbon dioxide ($CO_2$), nitrogen ($N_2$), and helium (He), thereby forming the etching mask film 20 (CrOCN film, Cr:35 at %) to a thickness of 10 nm on the light-shielding film 10 (front-surface antireflection layer 12). Further, the etching mask film 20 was annealed at a temperature lower than the annealing temperature of the light-shielding film 10, thereby adjusting the film stress of the etching mask film 20 to be as small as possible (preferably, substantially zero) without affecting the film stress of the light-shielding film 10.

Then, a chemically amplified positive resist for electron beam writing (PRL009: manufactured by FUJIFILM Electronic Materials Co., Ltd.) was coated on the etching mask film 20 to form a resist film 100 (see FIG. 13 and FIG. 14, (1)). The resist film 100 was formed by spin coating using a spinner (spin coating apparatus).

Then, using an electron beam writing apparatus, a transfer pattern including L&S of DRAM half-pitch (hp) 40 nm was written on the resist film 100 and, thereafter, the resist film 100 was developed with a predetermined developer, thereby forming a resist pattern 100a (see FIG. 14, (2)).

Then, using the resist pattern 100a as a mask, the etching mask film 20 was dry-etched, thereby forming an etching mask film pattern 20a (see FIG. 14, (3)). In this event, a mixed gas of chlorine and oxygen ($Cl_2:O_2=4:1$) was used as a dry etching gas for the etching mask film 20 made of CrOCN.

Then, the remaining resist pattern 100a was stripped by ashing or the like (see FIG. 14, (4)).

Then, using the etching mask film pattern 20a as a mask, the light-shielding film 10 was dry-etched, thereby forming a light-shielding film pattern 10a (see FIG. 14, (5)). In this event, a mixed gas of $SF_6$ and He was used as a dry etching gas for the MoSi-based light-shielding film 10 (the light-shielding layer 11 and the front-surface antireflection layer 12).

Finally, the etching mask film pattern 20a was removed using a mixed gas of chlorine and oxygen ($Cl_2:O_2=4:1$), thereby obtaining a binary transfer mask (see FIG. 14, (6)).

Then, using each of the binary transfer masks obtained in Examples 1 to 3, a transfer pattern was exposed and transferred to a resist film on a semiconductor wafer as a transfer object. An exposure apparatus was of the immersion type with annular illumination using an ArF excimer laser as a light source. Specifically, by setting the binary transfer mask of Example 1 on a mask stage of the exposure apparatus, a transfer pattern was exposed and transferred to an ArF immersion exposure resist film formed on a semiconductor wafer. Then, the exposed resist film was developed, thereby forming a resist pattern. Then, using the resist pattern, a circuit pattern including L&S of DRAM half-pitch (hp) 40 nm was formed on the semiconductor wafer.

Likewise, with respect to the binary transfer masks of Examples 2 and 3, exposure, transfer, and other processes were carried out in the same manner for ArF immersion exposure resist films on other semiconductor Wafers, thereby forming circuit patterns including L&S of DRAM half-pitch (hp) 40 nm on the semiconductor wafers, respectively.

The obtained circuit patterns on the semiconductor wafers of Examples 1 to 3 were observed using a transmission electron microscope (TEM). As a result, all the circuit patterns fully satisfied the specification of L&S of DRAM half-pitch (hp) 40 nm. That is, it was confirmed that the binary transfer masks of Examples 1 to 3 were fully able to transfer circuit patterns including LAS of DRAM half-pitch (hp) 40 nm onto semiconductor wafers, respectively, even in the case of such an exposure type using annular illumination as a light source.

While this invention has been described with reference to the embodiment and Examples, the technical scope of the invention is not limited to the scope of the description of the above-mentioned embodiment and Examples. It is obvious to a person skilled in the art that various changes or improvements can be added to the above-mentioned embodiment and Examples. It is clear from the description of claims that the modes added with such changes or improvements can also be included in the technical scope of this invention.

What is claimed is:

1. A mask blank for use in the manufacture of a binary mask adapted to be applied with ArF excimer laser exposure light, the mask blank comprising, on a transparent substrate, a light-shielding film for forming a transfer pattern,
wherein the light-shielding film has a laminated structure of a lower layer and an upper layer and has an optical density of 2.8 or more for the exposure light,
the lower layer is made of a material containing transition metal and silicon, and having a refractive index n of 1.80 or less and an extinction coefficient k of 2.37 or more, and has a thickness of 30 nm or more,
the upper layer is made of a material having a refractive index n of 2.00 or more and an extinction coefficient k of 1.00 or less, and has a thickness of 3 nm or more and 6 nm or less, and
a phase difference between the exposure light transmitted through the light-shielding film and the exposure light transmitted in air for a distance equal to the thickness of the light-shielding film is 30 degrees or less.

2. The mask blank according to claim 1, wherein the upper layer is made of:
a material containing a transition metal, silicon, and at least one element from oxygen and nitrogen,
a material containing silicon and at least one element from oxygen and nitrogen, or a material containing a transition metal and at least one element from oxygen and nitrogen.

3. The mask blank according to claim 1, wherein the upper layer is made of: a material containing a transition metal, silicon, and at least one element from oxygen and nitrogen.

4. The mask blank according to claim 2, wherein the transition metal in the upper layer is molybdenum (Mo).

5. The mask blank according to claim 1, the lower layer is made of a material in which the total content of a transition metal and silicon is 90 at % or more.

6. The mask blank according to claim 1, wherein the transition metal in the lower layer is molybdenum (Mo).

7. The mask blank according to claim 6, wherein a ratio obtained by dividing a content of molybdenum in the lower layer by the total content of molybdenum and silicon in the lower layer is 2% or more, and 35% or less.

8. The mask blank according to claim 1, wherein the upper layer is formed by a sputtering method such that the refractive index n and the extinction coefficient k are different from that of the lower layer.

9. A method of manufacturing a transfer mask, comprising an etching step of patterning, by etching, the light-shielding film in the mask blank according to claim 1.

10. A binary transfer mask adapted to be applied with ArF excimer laser exposure light, the transfer mask comprising, on a transparent substrate, a light-shielding film having a transfer pattern,
wherein the light-shielding film has a laminated structure of a lower layer and an upper layer and has an optical density of 2.8 or more for the exposure light,
the lower layer is made of a material containing transition metal and silicon, and having a refractive index n of 1.80 or less and an extinction coefficient k of 2.37 or more, and has a thickness of 30 nm or more,
the upper layer is made of a material having a refractive index n of 2.00 or more and an extinction coefficient k of 1.00 or less, and has a thickness of 3 nm or more and 6 nm or less, and
a phase difference between the exposure light transmitted through the light-shielding film and the exposure light transmitted in air for a distance equal to the thickness of the light-shielding film is 30 degrees or less.

11. The binary transfer mask according to claim 10, wherein the upper layer is made of:
a material containing a transition metal, silicon, and at least one element from oxygen and nitrogen,
a material containing silicon and at least one element from oxygen and nitrogen, or
a material containing a transition metal and at least one element from oxygen and nitrogen.

12. The binary transfer mask according to claim 10, wherein the upper layer is made of: a material containing a transition metal, silicon, and at least one element from oxygen and nitrogen.

13. The binary transfer mask according to claim 11, wherein the transition metal in the upper layer is molybdenum (Mo).

14. The binary transfer mask according to claim 10, the lower layer is made of a material in which the total content of a transition metal and silicon is 90 at % or more.

15. The binary transfer mask according to claim 10, wherein the transition metal in the lower layer is molybdenum (Mo).

16. The binary transfer mask according to claim 15, wherein a ratio obtained by dividing a content of molybdenum in the lower layer by the total content of molybdenum and silicon in the lower layer is 2% or more, and 35% or less.

17. The binary transfer mask according to claim 10, wherein the upper layer is formed by a sputtering method such that the refractive index n and the extinction coefficient k are different from that of the lower layer.

18. The binary transfer mask according to claim 10, wherein the transfer pattern of the light-shielding film includes a line & space pattern of half-pitch 40 nm or less.

19. A method of manufacturing a semiconductor device, comprising forming a circuit pattern on a semiconductor wafer using the binary transfer mask according to claim 10.

20. The method according to claim 19, wherein the circuit pattern formed on the semiconductor wafer includes a line & space pattern of half-pitch 40 nm or less.

* * * * *